United States Patent
Dong et al.

(10) Patent No.: US 12,342,620 B2
(45) Date of Patent: Jun. 24, 2025

(54) ARRAY SUBSTRATE AND DISPLAY PANEL INCLUDING ELECTRICALLY CONNECTED GATES

(71) Applicant: BOE Technology Group Co., Ltd., Beijing (CN)

(72) Inventors: Xue Dong, Beijing (CN); Guangcai Yuan, Beijing (CN); Ce Ning, Beijing (CN); Zhiwei Liang, Beijing (CN); Feng Guan, Beijing (CN); Zhaohui Qiang, Beijing (CN); Yingwei Liu, Beijing (CN); Ke Wang, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 443 days.

(21) Appl. No.: 17/772,234

(22) PCT Filed: May 18, 2021

(86) PCT No.: PCT/CN2021/094250
§ 371 (c)(1),
(2) Date: Apr. 27, 2022

(87) PCT Pub. No.: WO2022/001431
PCT Pub. Date: Jan. 6, 2022

(65) Prior Publication Data
US 2022/0375966 A1  Nov. 24, 2022

(30) Foreign Application Priority Data
Jun. 29, 2020 (CN) .......................... 202010610164.1

(51) Int. Cl.
*H10D 86/60* (2025.01)
*H01L 23/00* (2006.01)
(Continued)

(52) U.S. Cl.
CPC ............. *H10D 86/60* (2025.01); *H01L 24/05* (2013.01); *H01L 24/13* (2013.01); *H01L 24/16* (2013.01);
(Continued)

(58) Field of Classification Search
CPC . H01L 27/124; H01L 27/127; H01L 27/1255; H01L 27/1225; H01L 27/156;
(Continued)

(56) References Cited

U.S. PATENT DOCUMENTS 8,541,819 B1 * 9/2013 Or-Bach ................ H10B 41/35
257/E23.079
9,349,849 B2 * 5/2016 Tanaka .................. H01L 27/124
(Continued)

FOREIGN PATENT DOCUMENTS

CN 105070764 A 11/2015
CN 106129012 A 11/2016
(Continued)

OTHER PUBLICATIONS

Chinese Office Action issued Jan. 28, 2023 in corresponding Chinese Patent Application No. 202010610164.1 (with English translation), 25 pages.
(Continued)

*Primary Examiner* — Ida M Soward
(74) *Attorney, Agent, or Firm* — XSENSUS LLP

(57) ABSTRACT

An array substrate includes a base substrate, a driving circuit layer, and a functional device layer which are sequentially stacked; the driving circuit layer is provided with first driving circuits, and each first driving circuit at least includes a driving transistor; and the driving circuit layer includes a first gate layer, a first gate insulation layer, a semiconductor layer, a second gate insulation layer, a second gate layer, an interlayer dielectric layer, and a source-drain
(Continued)

metal layer which are sequentially stacked on one side of the base substrate.

20 Claims, 10 Drawing Sheets

(51) Int. Cl.
*H10D 86/01* (2025.01)
*H10D 86/40* (2025.01)
*H01L 25/16* (2023.01)

(52) U.S. Cl.
CPC ....... *H10D 86/0221* (2025.01); *H10D 86/441* (2025.01); *H01L 25/167* (2013.01); *H01L 2224/05073* (2013.01); *H01L 2224/05155* (2013.01); *H01L 2224/05166* (2013.01); *H01L 2224/0518* (2013.01); *H01L 2224/05573* (2013.01); *H01L 2224/05647* (2013.01); *H01L 2224/13022* (2013.01); *H01L 2224/13147* (2013.01); *H01L 2224/16148* (2013.01); *H01L 2924/0133* (2013.01); *H10D 86/481* (2025.01)

(58) Field of Classification Search
CPC ... H01L 29/78648; H01L 24/05; H01L 24/13; H01L 24/16; H01L 25/167; H01L 2224/05073; H01L 2224/05155; H01L 2224/05166; H01L 2224/0518; H01L 2224/05573; H01L 2224/05647; H01L 2224/13022; H01L 2224/13147; H01L 2224/16148; H01L 2224/16145; H01L 2224/16147; H01L 2924/0133; G09F 9/33; H10D 86/60; H10D 86/441; H10D 86/481; H10D 86/423; H10D 30/6734; H10H 29/142
See application file for complete search history.

(56) References Cited

U.S. PATENT DOCUMENTS

| | | | |
|---|---|---|---|
| 10,559,667 B2* | 2/2020 | Tsubuku | H01L 27/1225 |
| 11,574,945 B2* | 2/2023 | Onuki | H01L 27/0688 |
| 2013/0075733 A1* | 3/2013 | Saito | H01L 29/78 438/151 |
| 2016/0300952 A1* | 10/2016 | Toriumi | H10D 30/6729 |
| 2017/0062619 A1* | 3/2017 | Sasagawa | H10D 64/517 |
| 2017/0263651 A1* | 9/2017 | Tochibayashi | H10D 86/423 |
| 2017/0293171 A1* | 10/2017 | Yamazaki | H10D 86/471 |
| 2017/0323892 A1* | 11/2017 | Endo | H01L 27/1225 |
| 2017/0358582 A1* | 12/2017 | Zhou | H10D 86/481 |
| 2020/0075703 A1* | 3/2020 | Lee | H01L 27/1218 |
| 2020/0150472 A1 | 5/2020 | Kikuchi et al. | |
| 2020/0185386 A1* | 6/2020 | Yamazaki | H10D 84/00 |
| 2020/0203535 A1 | 6/2020 | Choi et al. | |
| 2020/0343278 A1* | 10/2020 | Fang | H01L 27/1255 |
| 2021/0036029 A1* | 2/2021 | Park | H01L 27/127 |
| 2021/0050398 A1* | 2/2021 | Kim | H10K 59/1216 |
| 2021/0134767 A1* | 5/2021 | Wang | H01L 33/60 |

FOREIGN PATENT DOCUMENTS

| | | |
|---|---|---|
| CN | 108257972 A | 7/2018 |
| CN | 207676912 U | 7/2018 |
| CN | 109817645 A | 5/2019 |
| CN | 110491887 A | 11/2019 |
| CN | 111354787 A | 6/2020 |
| CN | 111725250 A | 9/2020 |
| JP | H04-150071 A | 5/1992 |
| KR | 10-2020-0076995 A | 6/2020 |
| TW | 593790 B | 6/2004 |

OTHER PUBLICATIONS

International Search Report and Written Opinion mailed on Aug. 24, 2021, in corresponding PCT/CN2021/094250, 8 pages.

* cited by examiner

ARRAY SUBSTRATE AND DISPLAY PANEL INCLUDING ELECTRICALLY CONNECTED GATES

CROSS-REFERENCE TO RELATED APPLICATION

The disclosure is the U.S. national phase application of PCT Application No. PCT/CN2021/094250, filed May 18, 2021, which claims the priority of the Chinese patent application No. 202010610164.1, filed Jun. 29, 2020 and titled "ARRAY SUBSTRATE AND MANUFACTURING METHOD THEREFOR, AND DISPLAY PANEL", the entire contents of both of which are incorporated herein by reference in their entirety.

TECHNICAL FIELD

The disclosure relates to the field of display technology, and in particular, to an array substrate, a manufacturing method thereof, and a display panel.

BACKGROUND

Relatively large driving currents are generally required to drive current-driven light-emitting devices such as Micro LEDs (Micro Light Emitting Diodes). However, it is difficult for the driving circuit of a conventional display panel to provide the large driving current. Specifically, a driving transistor is easily subject to the floating body effect, which leads to a decrease in the saturation current, thereby restricting improvement of display quality of the Micro LED display panel.

It should be noted that the information disclosed in this section is only for enhancing understanding of the background of the disclosure, and therefore may contain information that does not constitute the prior art that is already known to those skilled in the art.

SUMMARY

The disclosure is directed to provide an array substrate, a manufacturing method thereof, and a display panel, which can improve the saturation current of the driving transistor.

To achieve the above-mentioned purpose, the disclosure adopts the following technical solutions.

According to a first aspect of the disclosure, there is provided an array substrate, including a base substrate, a driving circuit layer and a functional device layer stacked in sequence; wherein the driving circuit layer is provided with a first driving circuit, and the first driving circuit includes at least a driving transistor.

The driving circuit layer includes a first gate layer, a first gate insulating layer, a semiconductor layer, a second gate insulating layer, a second gate layer, an interlayer dielectric layer and a source-drain metal layer sequentially stacked on the base substrate. The first gate layer includes a first gate of the driving transistor. The semiconductor layer includes an active layer of the driving transistor, the active layer of the driving transistor is provided with a channel region of the driving transistor, and an orthographic projection of the first gate of the driving transistor on the semiconductor layer at least partially overlaps with the channel region of the driving transistor. The second gate layer includes a second gate of the driving transistor, and an orthographic projection of the second gate of the driving transistor on the semiconductor layer at least partially overlaps with the channel region of the driving transistor. The source-drain metal layer includes a source and a drain of the driving transistor.

The first gate and the second gate of the driving transistor are electrically connected through the source-drain metal layer. The functional device layer includes a functional device, and the functional device is electrically connected to the drain of the driving transistor.

In some embodiments of the disclosure, the source-drain metal layer further includes a gate bridge lead of the driving transistor; and in the driving transistor, the first gate and the second gate are connected with the gate bridge lead.

In some embodiments of the disclosure, the driving circuit layer includes a first via hole and a second via hole.

The first via hole penetrates through the interlayer dielectric layer, the second gate insulating layer and the first gate insulating layer, and exposes at least a partial region of the first gate of the driving transistor. The second via hole penetrates the interlayer dielectric layer and the second gate insulating layer, and exposes at least a partial region of the second gate of the driving transistor.

The gate bridge lead is connected to the first gate through the first via hole, and connected to the second gate through the second via hole.

In some embodiments of the disclosure, the first driving circuit further includes a storage capacitor; the first gate layer further includes a first electrode plate of the storage capacitor, and the second gate layer further includes a second electrode plate of the storage capacitor.

In some embodiments of the disclosure, the first driving circuit further includes a switch transistor; the semiconductor layer further includes an active layer of the switch transistor, the active layer of the switch transistor is provided with a channel region of the switch transistor; and a width of the channel region of the driving transistor is greater than a width of the channel region of the switch transistor.

In some embodiments of the disclosure, a material of the semiconductor layer includes low temperature polysilicon.

In some embodiments of the disclosure, a thickness of the semiconductor layer is 30-60 nanometers.

In some embodiments of the disclosure, the driving circuit layer further includes: a planarization layer and an electrode layer.

The planarization layer is disposed on one side of the source-drain metal layer away from the base substrate.

The electrode layer is disposed on one side of the planarization layer away from the base substrate, and having a thickness greater than 1 micron; wherein the electrode layer includes a first electrode of the first driving circuit and a second electrode; and in the first driving circuit, the first electrode is connected to the drain of the driving transistor.

The functional device is connected to the second electrode and the first electrode.

In some embodiments of the disclosure, the electrode layer includes a first seed metal layer and a first electroplated metal layer.

The first seed metal layer is disposed on one side of the source-drain metal layer away from the base substrate, connected to the drain of the driving transistor, and having a thickness not greater than 1 micron.

The first electroplated metal layer is disposed on one side of the first seed metal layer away from the base substrate, and having a thickness of 1-20 microns.

The functional device is connected to the first electroplated metal layer.

In some embodiments of the disclosure, the electrode layer further includes a power supply lead, and the power supply lead is connected to the source of the driving transistor.

In some embodiments of the disclosure, the source-drain metal layer includes: a second seed metal layer and a second electroplated metal layer.

The second seed metal layer is disposed on one side of the interlayer dielectric layer away from the base substrate, connected to the active layer of the driving transistor, and having a thickness not greater than 1 micron.

The second electroplated metal layer is disposed on one side of the second seed metal layer away from the base substrate, and having a thickness of 1-20 microns.

In some embodiments of the disclosure, the source-drain metal layer further includes a second electrode and a power supply lead; the power supply lead is connected to the source of the driving transistor, and the functional device is connected to the second electrode and the drain of the driving transistor.

According to a second aspect of the disclosure, there is provided a display panel, including the array substrate as described above.

According to a third aspect of the disclosure, there is provided a method for manufacturing an array substrate, including sequentially forming a driving circuit layer and a functional device layer on one side of a base substrate; wherein the driving circuit layer is provided with a first driving circuit, and the first driving circuit includes at least a driving transistor; and forming the driving circuit layer includes:

forming a first gate layer on the one side of the base substrate, wherein the first gate layer includes a first gate of the driving transistor;

forming a first gate insulating layer on one side of the first gate layer away from the base substrate;

forming a semiconductor layer on one side of the first gate layer away from the base substrate, wherein the semiconductor layer includes an active layer of the driving transistor, the active layer of the driving transistor is provided with a channel region of the driving transistor, and an orthographic projection of the first gate of the driving transistor on the semiconductor layer at least partially coincides with the channel region of the driving transistor;

forming a second gate insulating layer on one side of the semiconductor layer away from the base substrate;

forming a second gate layer on one side of the second gate insulating layer away from the base substrate, wherein the second gate layer includes a second gate of the driving transistor, an orthographic projection of the second gate of the driving transistor on the semiconductor layer at least partially overlaps with the channel region of the driving transistor, and the first gate of the driving transistor is electrically connected to the second gate;

forming an interlayer dielectric layer on one side of the second gate layer away from the base substrate; and forming a source-drain metal layer on one side of the interlayer dielectric layer away from the base substrate, wherein the source-drain metal layer is connected to the active layer of the driving transistor, and the source-drain metal layer includes a source and a drain of the driving transistor.

In some embodiments of the disclosure, forming the interlayer dielectric layer on the one side of the second gate layer away from the base substrate includes:

forming an interlayer dielectric material layer on the one side of the second gate layer away from the base substrate; and forming, by performing a patterning operation on the interlayer dielectric material layer formed on the one side of the second gate layer away from the base substrate, a first via hole and a second via hole, wherein the first via hole exposes at least a partial region of the first gate of the driving transistor, and the second via hole exposes at least a partial region of the second gate of the driving transistor;

forming the source-drain metal layer on the one side of the interlayer dielectric layer away from the base substrate includes:

forming a source-drain metal material layer on the one side of the interlayer dielectric layer away from the base substrate; and forming, by performing a patterning operation on the source-drain metal material layer, the source, the drain and a gate bridge lead of the driving transistor, wherein the gate bridge lead is connected to the first gate through the first via hole, and connected to the second gate through the second via hole.

In the array substrate, the manufacturing method thereof, and the display panel according to the disclosure, the driving circuit layer includes a first gate layer, a first gate insulating layer, a semiconductor layer, and a second gate insulating layer, a second gate layer, an interlayer dielectric layer, and a source-drain metal layer that are sequentially stacked on one side of the base substrate. The channel region of the driving transistor is located between the first gate of the driving transistor and the second gate of the driving transistor, so as to avoid or relieve the floating body effect of the driving transistor, thereby eliminating reduction of the saturation current of the driving transistor caused by the floating body effect, and enabling the driving transistor to have a larger saturation current. In this way, the first driving circuit is able to provide a larger driving current for the functional device, so as to avoid the influence of insufficient driving current on the performance of the functional device, thereby improving the performance of the array substrate.

It is to be understood that the foregoing general description and the following detailed description are exemplary and explanatory only and are not restrictive of the disclosure.

BRIEF DESCRIPTION OF THE DRAWINGS

The above and other features and advantages of the disclosure will become more apparent from the detailed description of exemplary embodiments thereof with reference to the accompanying drawings.

Figure 1:
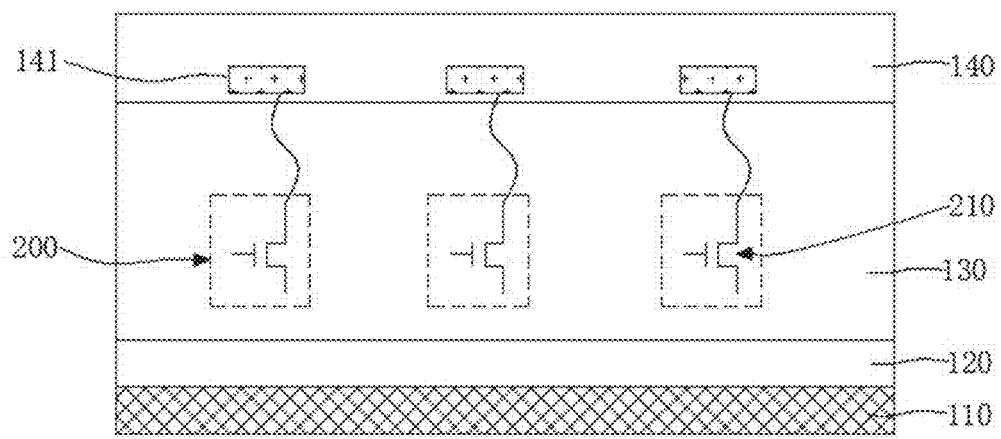
FIG. 1 is a schematic structural diagram of an array substrate according to some embodiments of the disclosure.

The main components in the drawings are described as follows:

110, substrate; 120, buffer layer; 130, driving circuit layer; 140, functional device layer; 141, functional device; 142, conductive connector; 200, first driving circuit; 210, driving transistor; 220, storage capacitor; 230, switch transistor; 310, first gate layer; 311, first gate of the driving transistor; 312, first electrode plate of the storage capacitor; 320, first gate insulating layer; 330, semiconductor layer; 331, active layer of the driving transistor; 3311, channel region of the driving transistor; 3312, source contact region of the driving transistor; 3313, drain contact region of the driving transistor; 332, active layer of the switch transistor; 3321, channel region of the switch transistor; 3322, source contact region of the switch transistor; 3323, drain contact region of the switch transistor; 340, second gate insulating layer; 350, second gate layer; 351, second gate of the driving transistor; 352, second electrode plate of the storage capacitor; 353, gate connection lead; 354, scan lead; 360, interlayer dielectric layer; 370, source-drain metal layer; 371, source of the driving transistor; 372, drain of the driving transistor; 373, gate bridge lead; 374, source of the switch transistor; 375, drain of the switch transistor; 380, planarization layer; 390, electrode layer; 391, first electrode; 411, first seed metal layer; 412, first electroplated metal layer; 421, second seed metal layer; 422, second electroplated metal layer; 501, second electrode; 502, power supply lead; 503, data lead; 601, first passivation layer; 603, third passivation layer; 701, first via hole; 702, second via hole; 703, third via hole; 704, fourth via hole; 705, fifth via hole; 706, sixth via hole; 707, seventh via hole; 708, eighth via hole.

DETAILED DESCRIPTION

Exemplary embodiments will now be described more fully with reference to the accompanying drawings. Exemplary embodiments, however, can be embodied in various forms and should not be construed as limited to the examples set forth herein. Instead, these embodiments are provided so that this disclosure will be thorough and complete, and will fully convey the concept of exemplary embodiments to those skilled in the art. The described features, structures, or characteristics may be combined in any suitable manner in one or more embodiments. In the following description, numerous specific details are provided in order to give a thorough understanding of the embodiments of the disclosure.

In the drawings, the thickness of regions and layers may be exaggerated for clarity. The same reference numerals in the drawings denote the same or similar structures, and thus their detailed descriptions will be omitted.

The described features, structures, or characteristics may be combined in any suitable manner in one or more embodiments. In the following description, numerous specific details are provided in order to give a thorough understanding of the embodiments of the disclosure. However, those skilled in the art will appreciate that the technical solutions of the disclosure may be practiced without one or more of the specific details, or other methods, components, materials, etc. may be employed. In other instances, well-known structures, materials, or operations are not shown or described in detail to avoid obscuring the main technical idea of the disclosure.

The terms "a", "an", "the" are used to indicate the presence of one or more elements/components/etc.; the terms "including" and "having" are used to indicate an open-ended inclusive meaning and refer to that additional elements/components/etc. may be present in addition to the listed elements/components/etc. The terms "first", "second" and the like are used only as labels and are not intended to limit the number of their objects.

The disclosure provides an array substrate. As shown in FIG. 1, the array substrate includes a base substrate 110, a driving circuit layer 130 and a functional device layer 140 stacked in sequence. The driving circuit layer 130 is provided with a first driving circuit 200, and the first driving circuit 200 includes at least a driving transistor 210.

Figure 2:
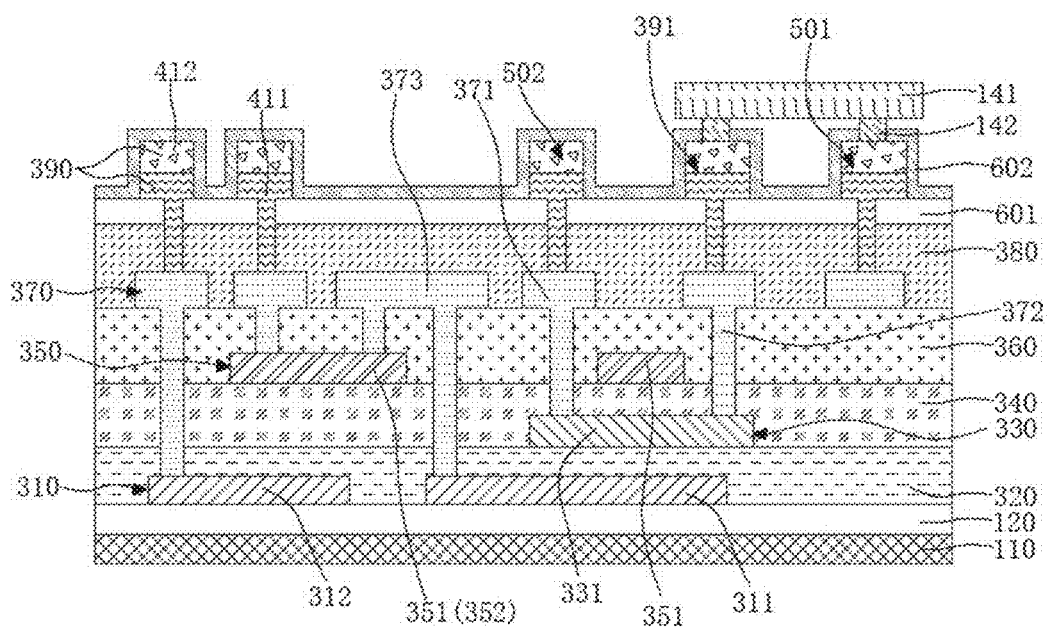
FIG. 2 is a schematic structural diagram of an array substrate according to some embodiments of the disclosure.
Figure 3:
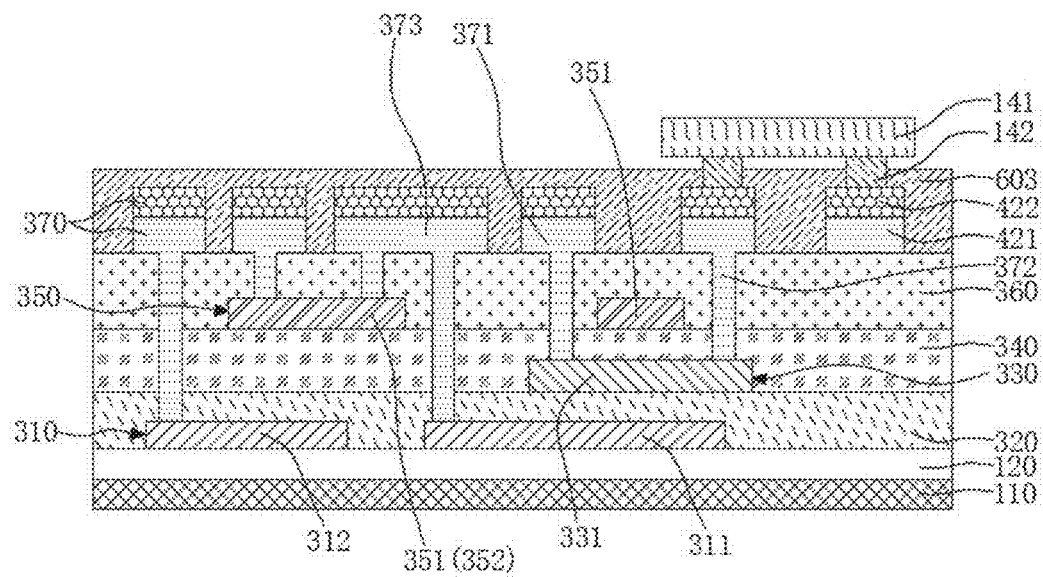
FIG. 3 is a schematic structural diagram of an array substrate according to some embodiments of the disclosure.

FIG. 2 and FIG. 3 further illustrate the structure of the array substrate. In FIG. 2 and FIG. 3, although the second gate 351 of the driving transistor is shown as two parts that are not connected, this is the cross-sectional state of the second gate 351 of the driving transistor at a specific cutting position. It should be understood that the second gate 351 of the driving transistor is actually a continuous integral structure, and when some other cutting positions are observed, the cross-section of the second gate 351 of the driving transistor is an integral structure.

Figure 4:
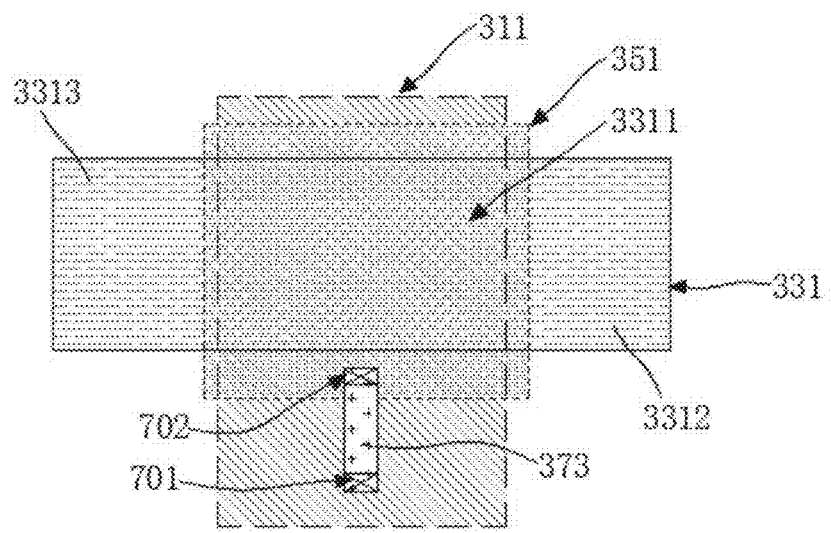
FIG. 4 is a schematic top-view structural diagram of a first electrode, an active layer, and a second electrode of a driving transistor according to some embodiments of the disclosure.
Figure 14:
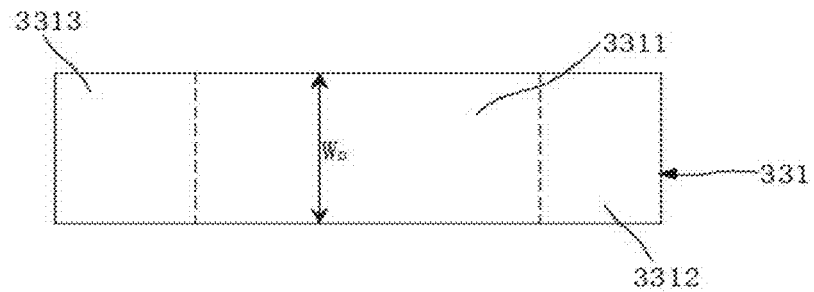
FIG. 14 is a schematic structural diagram of an active layer of a driving transistor according to some embodiments of the disclosure.

As shown in FIG. 2 and FIG. 3, the driving circuit layer 130 includes a first gate layer 310, a first gate insulating layer 320, a semiconductor layer 330, a second gate insulating layer 340, a second gate layer 350, an interlayer dielectric layer 360 and a source-drain metal layer 370 that are sequentially stacked on one side of the base substrate 110. The first gate layer 310 includes the first gate 311 of the driving transistor. The semiconductor layer 330 includes the active layer 331 of the driving transistor. As shown in FIG. 4 and FIG. 14, the active layer 331 of the driving transistor has a channel region 3311 of the driving transistor. The orthographic projection of the first gate 311 of the driving transistor on the semiconductor layer 330 at least partially overlaps with the channel region 3311 of the same driving transistor. The second gate layer 350 includes the second gate 351 of the driving transistor. The orthographic projection of the second gate 351 of the driving transistor on the semiconductor layer 330 at least partially overlaps with the channel region 3311 of the same driving transistor. The source-drain metal layer 370 is connected to the active layer 331 of the driving transistor, and the source-drain metal layer 370 includes the source 371 and the drain 372 of the driving transistor.

The first gate 311 and the second gate 351 of the same driving transistor are electrically connected through the source-drain metal layer 370. The functional device layer 140 includes a functional device 141 that is electrically connected to the drain 372 of the driving transistor.

In the array substrate according to the disclosure, the driving circuit layer 130 includes the first gate layer 310, the first gate insulating layer 320, the semiconductor layer 330, the second gate insulating layer 340, the second gate layer 350, the interlayer dielectric layer 360 and the source-drain metal layer 370 that are sequentially stacked on one side of the base substrate 110. The channel region 3311 of the driving transistor is located between the first gate 311 of the driving transistor and the second gate 351 of the driving transistor, so as to avoid or relieve the floating body effect of the driving transistor 210, thereby eliminating reduction of the saturation current of the driving transistor 210 caused by the floating body effect, and enabling the driving transistor 210 to have a larger saturation current. In this way, the first driving circuit 200 is able to provide a larger driving current for the functional device 141, so as to avoid the influence of insufficient driving current on the performance of the functional device 141, thereby improving the performance of the array substrate. In addition, the first gate 311 and the second gate 351 are electrically connected through the source-drain metal layer 370, thereby avoiding a patterning operation on the second gate insulating layer 340 before preparing the second gate layer 350. The patterning operations in the manufacturing process of the array substrate are reduced, the number of mask plates is reduced, and the manufacturing cost of the array substrate is further reduced.

In the disclosure, the saturation current of the driving transistor 210 refers to the leakage current of the saturated transistor when the driving transistor 210 is fully turned on.

Hereinafter, the structure, principle and effect of the array substrate according to the disclosure will be further explained and described with reference to the accompanying drawings.

The base substrate 110 may be the base substrate 110 of an inorganic material or the base substrate 110 of an organic material. For example, in some embodiments of the disclosure, the material of the base substrate 110 may be glass materials such as soda-lime glass, quartz glass, sapphire glass, etc., or may be metallic materials such as stainless steel, aluminum, nickel, etc. In some other embodiments of the disclosure, the material of the base substrate 110 may be polymethyl methacrylate (PMMA), polyvinyl alcohol (PVA), polyvinyl phenol (PVP), polyether sulfone (PES), polyimide, polyamide, polyacetal, poly carbonate (PC), polyethylene terephthalate (PET), polyethylene naphthalate (PEN) or a combination thereof. In some other embodiments of the disclosure, the base substrate 110 may also be a flexible base substrate 110, for example, the material of the base substrate 110 may be polyimide (PI). The base substrate 110 may also be a composite of multiple layers of materials. For example, in some embodiments of the disclosure, the base substrate 110 may include a bottom film layer, a pressure-sensitive adhesive layer, a first polyimide layer and a second polyimide layer.

In some embodiments, as shown in FIG. 2 and FIG. 3, a buffer layer 120 may also be provided on one side of the base substrate 110, and the driving circuit layer 130 is provided on one side of the buffer layer 120 away from the base substrate 110. The buffer layer 120 may include an inorganic insulating material, for example, may include silicon nitride, silicon oxide, silicon oxynitride, and the like. For example, in some embodiments of the disclosure, the buffer layer 120 includes a silicon nitride layer and a silicon oxide layer sequentially stacked on the base substrate 110. The silicon nitride layer has a thickness of 40-60 nanometers, and the silicon oxide layer has a thickness of 180-220 nm.

As shown in FIG. 1, the driving circuit layer 130 may have a plurality of first driving circuits 200, and any one of the first driving circuits 200 may have a driving transistor 210. As shown in FIG. 4, the driving transistor 210 may include an active layer 331, a first gate 311, a second gate 351, a source 371 (not shown in FIG. 4), and a drain 372 (not shown in FIG. 4). The active layer 331 and the first gate 311 are isolated by the first gate insulating layer 320, and the active layer 331 and the second gate 351 are isolated by the second gate insulating layer 340. The active layer 331 may include a channel region 3311, and a source contact region 3312 and a drain contact region 3313 on both sides of the channel region 3311, the source contact region 3312 is electrically connected to the source 371, and the drain contact region 3313 is electrically connected to the drain 372. Since the first gate 311 and the second gate 351 are electrically connected to each other, the first gate 311 and the second gate 351 can have the same voltage, so as to effectively isolate the active layer 331 from the base substrate 110, and avoid capacitance and charge accumulation between the active layer 331 and the base substrate 110, thereby reducing or eliminating the floating body effect of the driving transistor 210. When the first gate 311 and the second gate 351 are loaded with the driving signal related to the data voltage, the electric field generated by the first gate 311 and the second gate 351 can simultaneously act on the channel region 3311 of the driving transistor, thereby enabling the channel region 3311 to output the driving current more effectively and accurately in response to the data voltage. In addition, the first gate 311 and the second gate 351 are electrically connected to each other, so as to avoid formation of a parasitic capacitance between the first gate 311 and the second gate 351, thereby avoiding influence of the parasitic capacitance on the first driving circuit 200.

Figure 24:
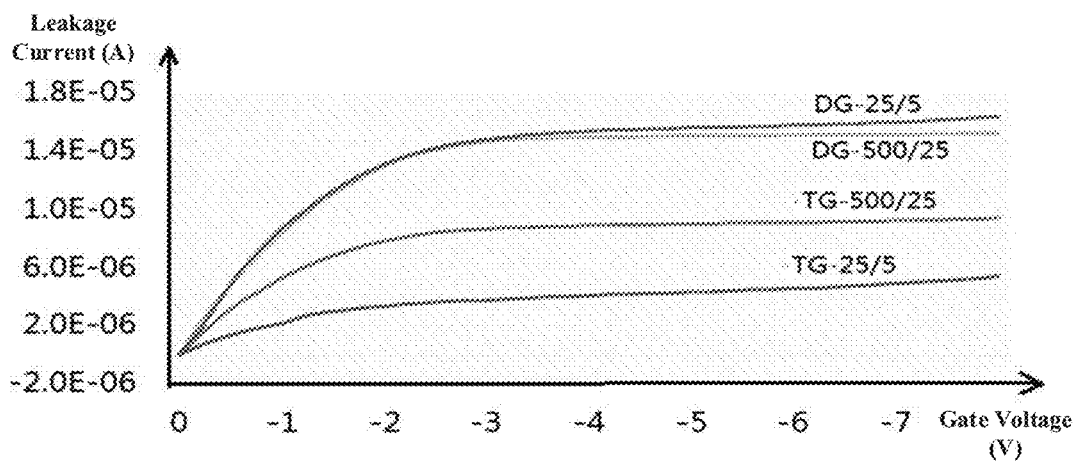
FIG. 24 is a graph illustrating comparison between output curves of a single-gate transistor and a dual-gate transistor.

FIG. 24 illustrates the output curves of some single-gate transistors and dual-gate transistors. The single-gate transistor has only one gate, and the gate may be located on one side of the active layer away from the base substrate or on one side of the active layer close to the base substrate. The dual-gate transistor has gates on both sides of the active layer, and the channel region is sandwiched between the two gates. Exemplarily, the driving transistor of the disclosure is a dual-gate transistor. In FIG. 24, DG-25/5 and DG-500/25 are dual-gate transistors, the channel region of DG-25/5 has a width of 25 microns and a length of 5 microns; and the channel region of DG-500/25 has a width of 500 microns and a length of 25 microns. TG-25/5 and TG-500/25 are single-gate transistors; the channel region of TG-25/5 has a width of 25 microns and a length of 5 microns; and the channel region of TG-500/25 has a width of 500 microns and a length of 25 microns. It can be seen from FIG. 24 that under the condition that the channel region has the same ratio of width (W) to length (L), the saturation current of the dual-gate transistor is larger than that of the single-gate transistor.

The drain 372 of the driving transistor is electrically connected to the functional device 141. In this way, the first driving circuit 200 can drive the functional device 141 connected thereto through the driving transistor 210. In some embodiments of the disclosure, the functional device 141 may be self-luminous devices driven by current such as Micro LEDs and Mini LEDs, and these functional devices 141 may form sub-pixels of the array substrate. The first driving circuit 200 may be used as a pixel driving circuit for driving these self-luminous devices. It should be understood that, in some embodiments, the driving circuit layer 130 may further include other driving circuits, for example, may also include a second driving circuit for fingerprint recognition, a third driving circuit for touch control, and the like. Whether the driving circuit layer 130 includes other driving circuits, and the number and types of other driving circuits, are not particularly limited.

In some embodiments, the material of the first gate layer 310 may be selected from conductive materials, for example, metals, conductive metal oxides, conductive polymers, conductive composite materials, or a combination thereof. Exemplarily, the metal may be selected from platinum, gold, silver, aluminum, chromium, nickel, copper, molybdenum, titanium, magnesium, calcium, barium, sodium, palladium, iron, manganese, or combinations thereof. Exemplarily, the conductive metal oxide may be selected from indium oxide, tin oxide, indium tin oxide, fluorine-doped tin oxide, aluminum-doped zinc oxide, gallium-doped zinc oxide, or combinations thereof. Exemplarily, the conductive polymer may be selected from polyaniline, polypyrrole, polythiophene, polyacetylene, poly(3,4-ethylenedioxythiophene)/polystyrene sulfonic acid (PEDOT/PSS) or combinations thereof. Dopants such as acids (such as hydrochloric acid, sulfuric acid, sulfonic acid, etc.), Lewis acids (such as phosphorus fluoride, arsenic fluoride, ferric chloride, etc.), halogens, and alkali metals may also be added to the conductive polymer. Exemplarily, the conductive composite material may be selected from conductive composite materials dispersed with carbon black, graphite powder, metal microparticles, and the like.

The first gate layer 310 may be a layer of conductive materials, or may be a stack of multiple layers of conductive materials. For example, in some embodiments of the disclosure, the first gate layer 310 may include a first conductive material layer, a second conductive material layer, and a first conductive material layer that are sequentially stacked, that is, a sandwich structure. The first conductive material layer may be selected from corrosion-resistant metals or alloys, such as molybdenum or titanium; the second conductive material layer may be selected from metals or alloys with high conductivity, such as copper, aluminum, silver, and the like. For another example, in some other embodiments of the disclosure, the first gate layer 310 may include a layer of conductive material, for example, the material of the first gate layer 310 may be molybdenum. The thickness of the first gate layer 310 may be 30-100 nm; optionally, the thickness of the gate layer may be 50 nm.

In some embodiments, a first gate material layer may be formed on one side of the base substrate 110, and then a patterning operation is performed on the first gate material layer to form the first gate layer 310. In some embodiments, the first gate material layer may be formed by a method of magnetron sputtering. Alternatively, in some other embodiments, the first gate layer 310 may also be directly formed by methods such as screen printing.

The first gate insulating layer 320 is disposed on one side of the first gate layer 310 away from the base substrate 110, and may be an organic or inorganic insulating material. In some embodiments, the material of the first gate insulating layer 320 may be silicon oxide, silicon nitride, silicon oxynitride or other inorganic insulating materials. For example, in some embodiments of the disclosure, the material of the first gate insulating layer 320 may be silicon oxide, and the thickness may be 60-150 nanometers.

In some embodiments, the first gate insulating layer 320 may be formed by physical vapor deposition, chemical vapor deposition, spin coating, screen printing, or other methods, which are not limited in the disclosure. For example, in some embodiments of the disclosure, a layer of silicon dioxide may be deposited on one side of the first gate layer 310 away from the base substrate 110 by plasma enhanced chemical vapor deposition (PECVD), to form the first gate insulating layer 320.

The semiconductor layer 330 is disposed on one side of the first gate insulating layer 320 away from the base substrate 110, and may include amorphous silicon semiconductor materials, low temperature polysilicon semiconductor materials, single crystal silicon semiconductor materials, metal oxide semiconductor materials, organic semiconductor materials or other types of semiconductor materials.

Optionally, in some embodiments of the disclosure, the material of the semiconductor layer 330 may include low temperature polysilicon. Further, the thickness of the semiconductor layer 330 is 30-60 nanometers, so as to avoid the saturation current of the driving transistor 210 from being reduced due to relatively small thickness.

In some embodiments of the disclosure, as shown in FIG. 4, the orthographic projection of the channel region 3311 of the driving transistor on the first gate layer 310 is located within the first gate 311 of the driving transistor. The orthographic projection of the channel region 3311 on the second gate layer 350 is located within the second gate 351 of the driving transistor. In this way, the channel region 3311 of the driving transistor can be completely controlled by the first gate and the second gate, so as to eliminate the floating body effect of the driving transistor 210, thereby ensuring that the driving transistor 210 has a large saturation current.

In some embodiments, a low temperature polysilicon material layer may be formed on one side of the first gate insulating layer 320 away from the base substrate 110, and then the low temperature polysilicon material layer may be patterned to form the semiconductor layer 330. In some embodiments, a PECVD method can be used to form an amorphous silicon layer on one side of the first gate insulating layer 320 away from the base substrate 110, and then the amorphous silicon layer can be scanned by an excimer laser, so that the amorphous silicon layer is crystallized into an amorphous silicon layer.

The second gate insulating layer 340 is disposed on one side of the semiconductor layer 330 away from the base substrate 110 for isolating the semiconductor layer 330 and the second gate layer 350. The material and thickness of the second gate insulating layer 340 may be the same as or different from those of the first gate insulating layer 320.

In some embodiments of the disclosure, the material of the second gate insulating layer 340 is silicon oxide, and the thickness is 60-200 nanometers. The second gate insulating layer 340 may be formed by the PECVD method.

The second gate layer 350 is disposed on one side of the second gate insulating layer 340 away from the base substrate 110. The material and thickness of the second gate layer 350 may be the same as or different from those of the first gate layer 310. In some embodiments, the thickness of the second gate layer 350 is greater than that of the first gate layer 310, so as to facilitate the preparation of gate leads required for the array substrate on the second gate layer 350 and reduce the square resistance of the gate leads.

In some embodiments of the disclosure, the material of the second gate layer 350 is molybdenum, and the thickness is 300-400 nanometers.

In some embodiments of the disclosure, the second gate material layer may be formed on one side of the second gate insulating layer 340 away from the base substrate 110 by a method of magnetron sputtering, and then the second gate material layer is patterned to form the second gate layer 350.

In some embodiments of the disclosure, in addition to the second gate 351 of the driving transistor, the second gate layer 350 may further include gate leads for transmitting various gate signals to the first driving circuit 200. For example, it may also include one or more of scan leads for transmitting scan signals, reset leads for transmitting reset signals, and initialization leads for transmitting initialization signals.

The interlayer dielectric layer 360 is disposed on one side of the second gate layer 350 away from the base substrate 110 for isolating the second gate layer 350 and the source-drain metal layer 370. In some embodiments, the material of the interlayer dielectric layer 360 may be an inorganic insulating material.

The interlayer dielectric layer 360 may include one layer of insulating material, or may include multiple layers of stacked insulating material. For example, in some embodiments of the disclosure, the interlayer dielectric layer 360 may include a silicon nitride layer and a silicon oxide layer sequentially stacked on one side of the second gate layer 350 away from the base substrate 110. The thickness of the silicon nitride layer is 150-250 nanometers, and the thickness of the silicon oxide layer is 250-350 nanometers.

In some embodiments, an interlayer dielectric material layer may be formed on one side of the second gate layer 350 away from the base substrate 110, and then the interlayer dielectric material layer is patterned to form the interlayer dielectric layer 360. Alternatively, the interlayer dielectric material layer may be formed by PECVD.

Figure 7:
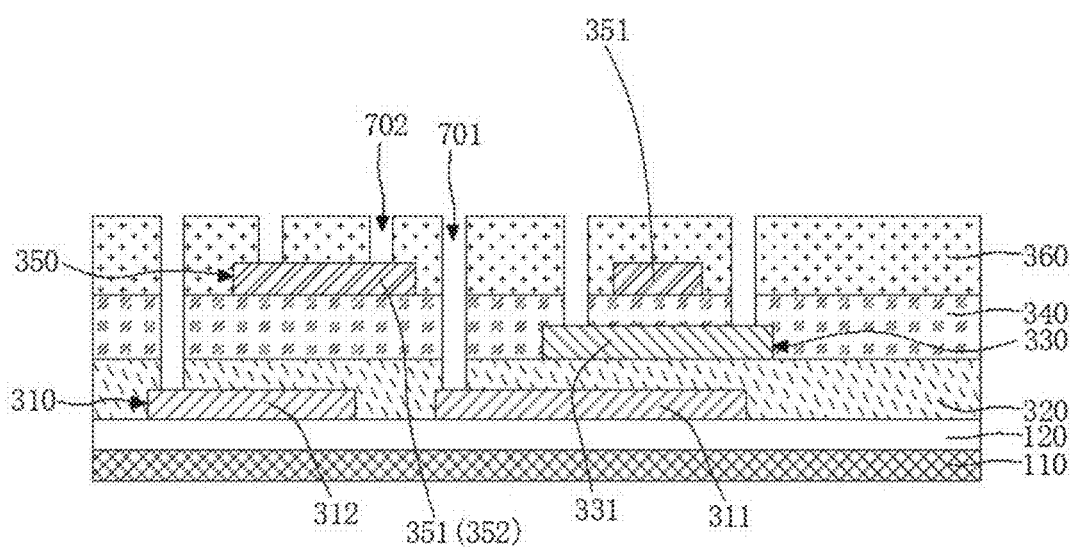
FIG. 7 is a schematic structural diagram of forming an interlayer dielectric layer according to some embodiments of the disclosure.

In some embodiments of the disclosure, as shown in FIG. 7, when the interlayer dielectric layer 360 is formed, a first via hole 701 exposing at least a partial region of the first gate 311 of the driving transistor and a second via hole 702 exposing at least a partial region of the second gate 351 of the driving transistor may also be formed. In other words, when the interlayer dielectric material layer is patterned, the first via hole 701 and the second via hole 702 may be formed. The first via hole 701 penetrates through the interlayer dielectric layer 360, the first gate insulating layer 320, and the second gate insulating layer 340, and the orthographic projection of the first via hole 701 on the first gate layer 310 is located on the first gate 311 of the driving transistor. The second via hole 702 penetrates through the interlayer dielectric layer 360 and the second gate insulating layer 340, and the orthographic projection of the second via hole 702 on the second gate layer 350 is located on the second gate 351 of the driving transistor.

Figure 8:
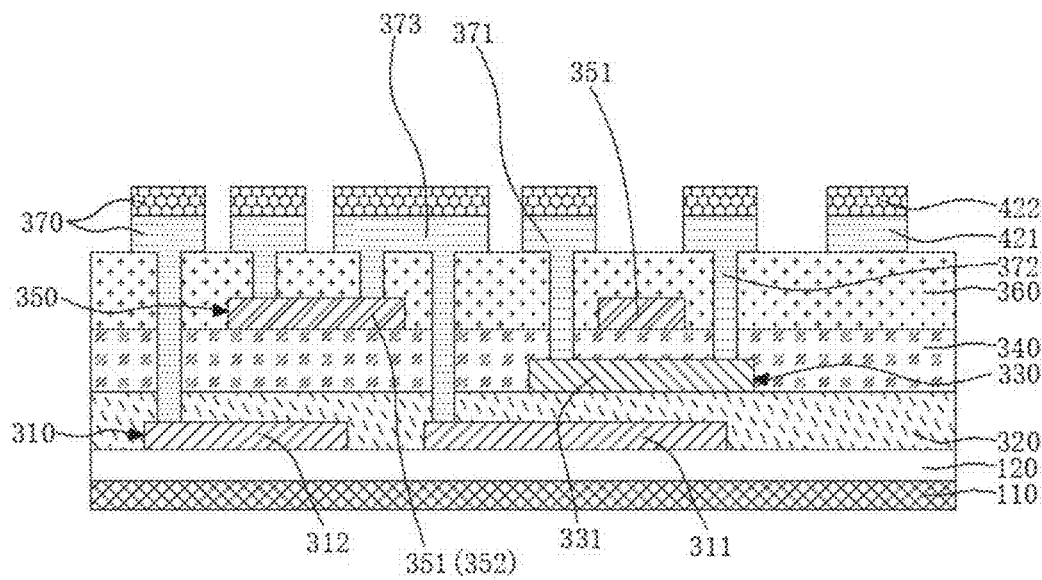
FIG. 8 is a schematic structural diagram of forming a source-drain metal layer according to some embodiments of the disclosure.
Figure 10:
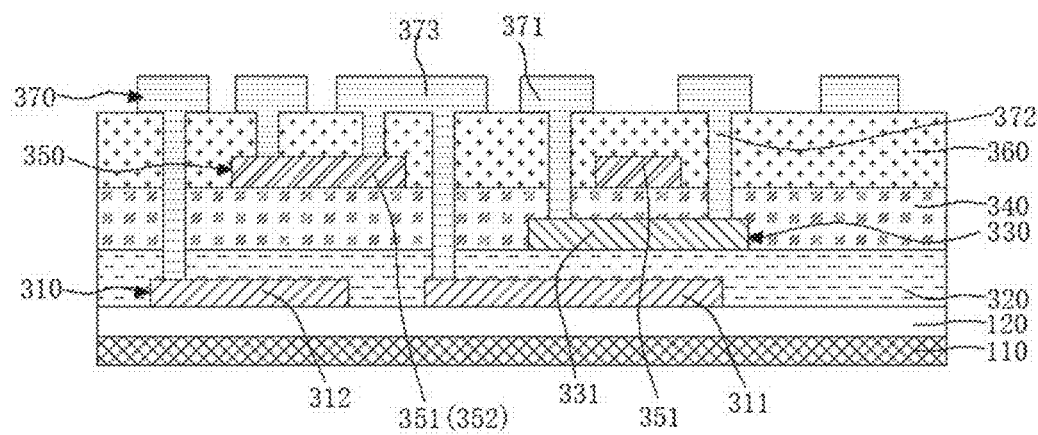
FIG. 10 is a schematic structural diagram of forming a source-drain metal layer according to some embodiments of the disclosure.

In this way, as shown in FIG. 8 and FIG. 10, when the source-drain metal layer 370 is formed, the source-drain metal layer 370 may further include the gate bridge lead 373 of the driving transistor 210. In the same driving transistor 210, the gate bridge lead 373 is connected to the first gate 311 through the first via hole 701, and connected to the second gate 351 through the second via hole 702, so that the first gate 311 and the second gate 351 are both electrically connected to the gate bridge lead 373. In this way, the first gate 311 and the second gate 351 of the driving transistor can be electrically connected through the gate bridge lead 373.

Figure 5:
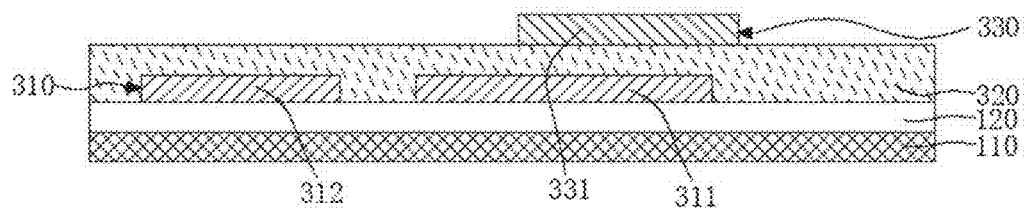
FIG. 5 is a schematic structural diagram of forming a semiconductor layer according to some embodiments of the disclosure.
Figure 6:
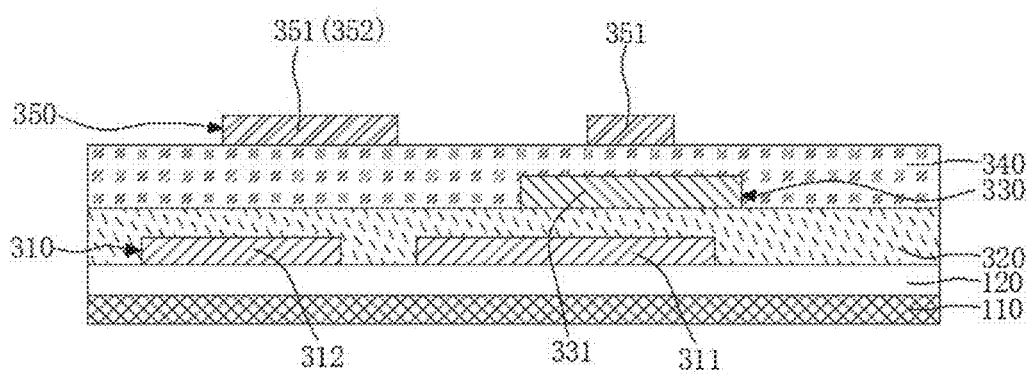
FIG. 6 is a schematic structural diagram of forming a second gate layer according to some embodiments of the disclosure.

In addition, as shown in FIG. 5 and FIG. 6, the first gate insulating layer 320 and the second gate insulating layer 340 may not need to be patterned separately, but can be patterned together when the interlayer dielectric material layer is patterned. In this way, the patterning operations during the preparation of the array substrate can be reduced, thereby reducing the preparation cost of the array substrate.

It should be understood that the interlayer dielectric layer 360 may also include other via holes, for example, including via holes for connecting the source 371 and drain 372 of the driving transistor with the active layer 331 of the driving transistor, which are not elaborated in this disclosure.

The source-drain metal layer 370 is disposed on one side of the interlayer dielectric layer 360 away from the base substrate 110, and includes the source 371 and the drain 372 of the driving transistor. The source-drain metal layer 370 may be directly connected to the functional device 141 or indirectly connected to the functional device 141 as a transition layer, which is not specifically limited in the disclosure.

In some embodiments, as shown in FIG. 2, the source-drain metal layer 370 may be used as a transfer layer to indirectly connect with the functional device 141. As shown in FIG. 10, the source-drain metal layer 370 may include a source 371 of the driving transistor, a drain 372 of the driving transistor, a data transfer electrode, a power transfer electrode, and the like.

In some embodiments, the thickness of the source-drain metal layer 370 may not be greater than 1 micrometer (μm), so as to facilitate the preparation by the method of magnetron sputtering. For example, a metal material may be deposited on one side of the interlayer dielectric layer 360 away from the base substrate 110 by magnetron sputtering, thereby forming a source-drain metal material layer; and then the source-drain metal material layer is patterned to form the source-drain metal layer 370.

Further, the source-drain metal layer 370 may be one layer of metal material, or may be a stack of multiple layers of metal materials. For example, the source-drain metal layer 370 may include one layer of a first conductive material layer, one layer of a second conductive material layer, and another layer of the first conductive material that are stacked in sequence, that is, a sandwich structure. In some embodiments, the first conductive material may be selected from corrosion-resistant metals or alloys, such as molybdenum or titanium; the second conductive material may be selected from metals or alloys with high conductivity, such as copper, aluminum, silver, and the like. In some embodiments of the disclosure, the source-drain metal layer 370 may include a titanium layer, an aluminum layer, and a titanium layer that are stacked in sequence.

As shown in FIG. 2, the driving circuit layer 130 may further include a planarization layer 380 and an electrode layer 390. The planarization layer 380 is provided on one side of the source-drain metal layer 370 away from the base substrate 110. The electrode layer 390 is provided on one side of the planarization layer 380 away from the base substrate 110, and has a thickness greater than 1 μm. The electrode layer 390 includes the first electrode 391 of the first driving circuit 200 and the second electrode 501. In the same first driving circuit 200, the first electrode 391 is connected to the drain 372 of the driving transistor; and the functional device 141 is connected to the second electrode 501 and the first electrode 391. In some embodiments of the disclosure, the second electrode 501 may be a common electrode; and the first electrode 391 may be an electrode for loading a driving signal, for example, a pixel electrode of the display panel.

In this way, the source-drain metal layer 370 may serve as the transfer layer, so that the first electrode 391 of the array substrate is electrically connected to the drain 372 of the driving transistor. Since the thickness of the electrode layer 390 is greater than 1 μm, the square resistance of the electrode layer 390 is small, and the voltage drop on the second electrode 501 can be reduced.

In some embodiments, as shown in FIG. 2, the electrode layer 390 may further include a power supply lead 502 for transmitting the power supply voltage. Since the thickness of the electrode layer 390 is greater than 1 μm, the square resistance of the electrode layer 390 is small, so that the voltage drop on the power supply lead 502 can be reduced.

In some embodiments, the electrode layer 390 may further include data leads for transmitting data signals. Since the thickness of the electrode layer 390 is greater than 1 μm, the square resistance of the electrode layer 390 is small, so that the voltage drop on the data leads can be reduced.

In some embodiments, the electrode layer 390 may further include bonding pads for bonding with the driver.

Further, the source-drain metal layer 370 may further include first source-drain leads, where part of the first source-drain leads is connected to the power supply lead 502, so that the voltage drop on the power supply lead 502 can be further reduced. Part of the first source-drain leads may be connected to the data leads, so that the voltage drop on the data leads 503 can be further reduced. Part of the first source-drain leads may be connected to the second electrode 501, so that the voltage drop on the second electrode 501 can be further reduced. Part of the first source-drain leads may be connected to the bonding pads.

Figure 12:
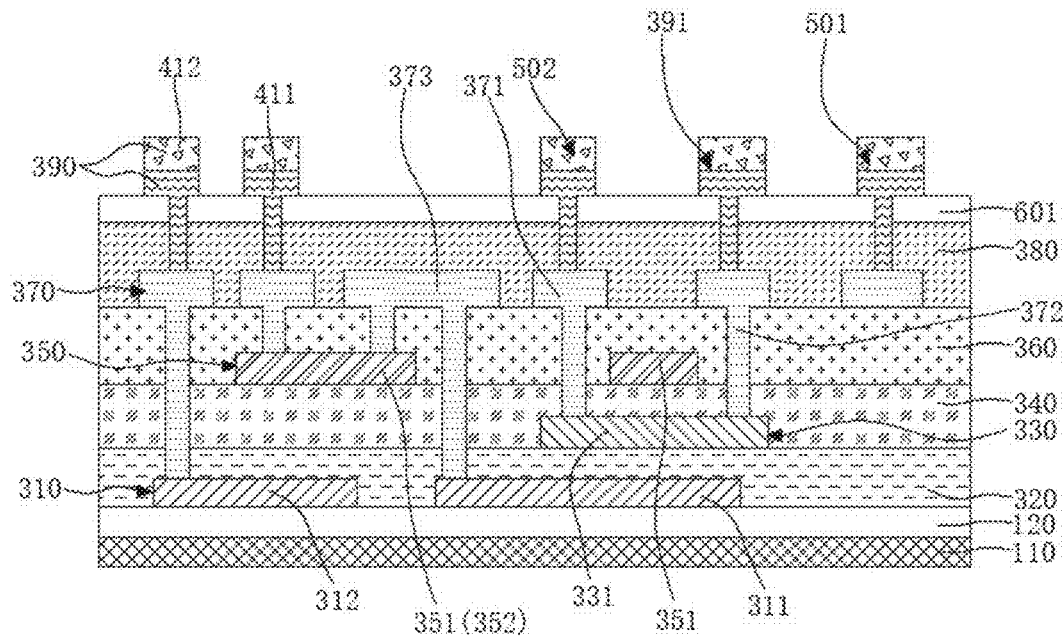
FIG. 12 is a schematic structural diagram of forming an electrode layer according to some embodiments of the disclosure.

In some embodiments, as shown in FIG. 2 and FIG. 12, the electrode layer 390 includes a first seed metal layer 411 and a first electroplated metal layer 412. The first seed metal layer 411 is provided on one side of the planarization layer 380 away from the base substrate 110, and connected to the drain 372 of the driving transistor. The thickness of the first seed metal layer 411 is not greater than 1 μm. The first electroplated metal layer 412 is provided on one side of the first seed metal layer 411 away from the base substrate 110. The thickness of the first electroplated metal layer 412 is 1-20 μm. The functional device 141 is electrically connected to the first electroplated metal layer 412. In this way, the first seed metal layer 411 can be formed by sputtering, and the first electroplated metal layer 412 can be formed by electroplating.

In some embodiments, the first seed metal layer 411 includes an MTD (molybdenum-titanium-nickel) alloy layer and a copper layer sequentially stacked on one side of the planarization layer 380 away from the base substrate 110, where the thickness of the MTD alloy layer is 30-50 nanometer (nm), the thickness of the copper layer is 200 to 400 nm.

In some embodiments, the material of the first electroplated metal layer 412 may be copper, and the thickness of the first electroplated metal layer 412 may be 2-5 μm.

Exemplarily, in some embodiments of the disclosure, the electrode layer 390 may be formed by the following steps: forming a first seed metal material layer on one side of the planarization layer 380 away from the base substrate 110; forming a removable pattern-defining layer on the surface of the first seed metal material layer away from the base substrate 110, where the removable pattern-defining layer is provided with lead openings, and the lead openings expose part of the first seed metal material layer, forming the first electroplated metal material layer on the surface of the first seed metal material layer by means of electroplating processes in the lead openings; removing the removable pattern defining layer; removing the part of the first seed metal material layer not covered by the first electroplated metal material layer to form the source-drain metal layer 370. In some embodiments, the first electroplated metal material layer may be used as a mask, and the part of the first seed metal material layer that is not covered by the first electroplated metal material layer may be removed by etching. The remaining part of the first seed metal material layer forms the first seed metal layer 411, and the remaining part of the first electroplated metal material layer forms the first electroplated metal layer 412. In this way, the electrode layer 390 can be prepared by adopting a strategy of "forming a whole surface of seed layer—defining an electroplating pattern—metal electroplating—patterning the seed layer", which can improve the morphology of the first electroplated metal layer 412.

Figure 11:
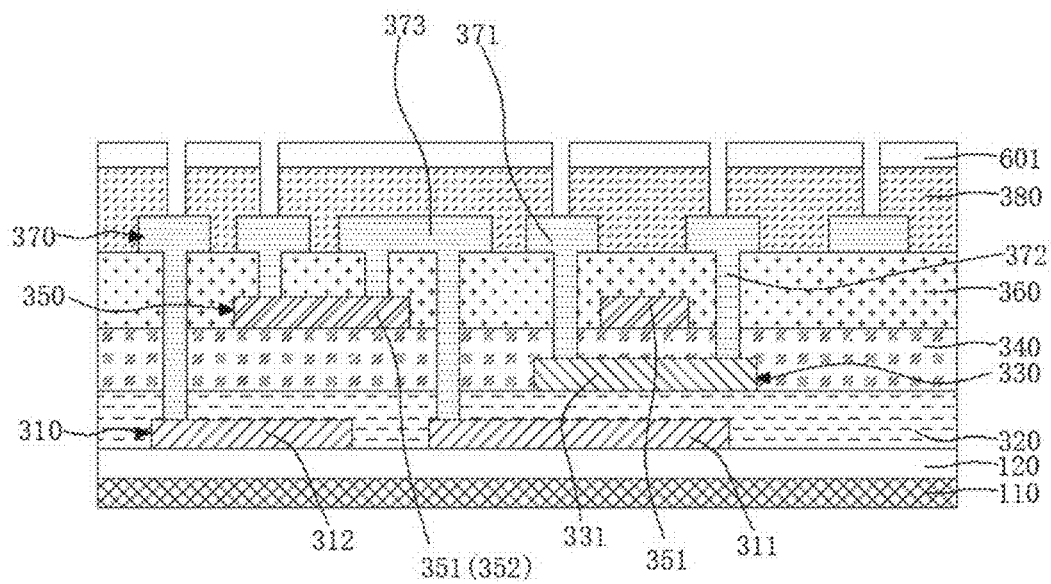
FIG. 11 is a schematic structural diagram of forming a planarization layer and a first passivation layer according to some embodiments of the disclosure.

In some embodiments, as shown in FIG. 2, FIG. 11 and FIG. 12, the array substrate may further include a first passivation layer 601. The first passivation layer 601 is located between the planarization layer 380 and the electrode layer 390 for protecting the electrode layer 390, so as to prevent the active metal (e.g., copper) in the electrode layer 390 from being eroded. In some embodiments, the thickness of the first passivation layer 601 is 100-200 nm, and the material may be silicon oxynitride.

Figure 13:
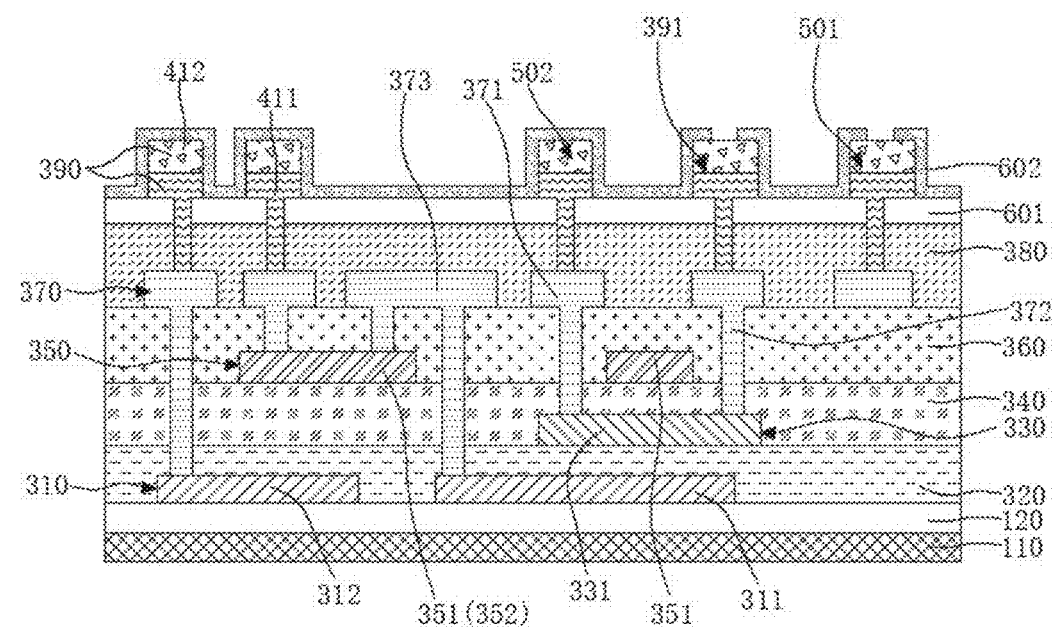
FIG. 13 is a schematic structural diagram of forming a second passivation layer according to some embodiments of the disclosure.

In some embodiments, as shown in FIG. 2 and FIG. 13, the array substrate may further include a second passivation layer 602. The first passivation layer 601 is located on one side of the electrode layer 390 away from the base substrate 110 for protecting the electrode layer 390, so as to prevent the active metal (e.g., copper) in the electrode layer 390 from being corroded. In some embodiments, the thickness of the second passivation layer 602 is 100-200 nm, and the material may be silicon oxynitride.

In some embodiments as described above, the source-drain metal layer 370 is connected to the electrode layer 390 as a transfer layer. In some cases, part of the first source-drain leads in the source-drain metal layer 370 may also be connected in parallel with the conductive structure on the electrode layer 390, so as to reduce the square resistance of the conductive structure on the electrode layer 390, reduce the impedance of the signal and provide large current.

Compared with the technical solution of stacking the multi-layer source-drain structure in the related art, the thickness of the electrode layer 390 is increased through the electroplating process according to the embodiments, thereby reducing the number of layers of the stacked source-drain structures. In this way, the number of masking plates during the preparation of the array substrate can be reduced, thereby reducing the preparation processes of the array substrate and reducing the preparation cost of the array substrate.

In some other embodiments, the source-drain metal layer 370 is also directly connected to the functional device 141. As shown in FIG. 3, the source-drain metal layer 370 may further include a second source-drain lead of the driving circuit layer 130, and the second source-drain lead may include one or more of a power supply lead for transmitting a power supply voltage, a second electrode for transmitting a common voltage, data leads for transmitting data signals. The power supply lead may be electrically connected to the source 371 of the driving transistor. One end of the functional device 141 may be connected to the drain 372 of the driving transistor, and the other end may be connected to the second electrode. Further, the source-drain metal layer 370 may also be formed with bonding pads, and the bonding pads are used for bonding the array substrate and the driver.

Further, the thickness of the source-drain metal layer 370 can be greater than 1 μm, so that each of the second source-drain leads has a relatively large thickness, thereby reducing the square resistance of the second source-drain lead and reducing the voltage drop of each signal on the second source-drain lead.

Further, as shown in FIG. 3 and FIG. 8, the source-drain metal layer 370 may include a second seed metal layer 421 and a second electroplated metal layer 422 stacked on one side of the interlayer dielectric layer 360 away from the base substrate 110. The second seed metal layer 421 is disposed on one side of the interlayer dielectric layer 360 away from the base substrate 110 and is connected to the active layer 331 of the driving transistor. The thickness of the second seed metal layer 421 is not greater than 1 μm. The second electroplated metal layer 422 is disposed on one side of the second seed metal layer 421 away from the base substrate 110, and the thickness of the second electroplated metal layer 422 is 1-20 μm. In this way, the second seed metal layer 421 may be formed by sputtering, and the second electroplated metal layer 422 may be formed by electroplating.

In some embodiments, the second seed metal layer 421 includes an MTD (molybdenum-titanium-nickel) alloy layer and a copper layer sequentially stacked on one side of the interlayer dielectric layer 360 away from the base substrate 110, where the thickness of the MTD alloy layer is 30-50 nm, and the thickness of the copper layer is 200 to 400 nm.

In some embodiments, the material of the second electroplated metal layer 422 may be copper, and the thickness of the second electroplated metal layer 422 may be 2-5 μm.

Exemplarily, in some embodiments of the disclosure, the source-drain metal layer 370 may be formed by the following steps: forming a second seed metal material layer on one side of the interlayer dielectric layer 360 away from the base substrate 110; forming a removable pattern-defining layer on the surface of the seed metal material layer away from the base substrate 110, where the removable pattern-defining layer is provided with lead openings, and the lead openings expose a part of the second seed metal material layer; forming the second electroplated metal material layer on the surface of the second seed metal material layer through an electroplating process within the lead openings; removing the removable pattern defining layer, and removing a part of the second seed metal material layer not covered by the second electroplated metal material layer to form the source-drain metal layer 370. In some embodiments, the second electroplated metal material layer may be used as a mask, and the part of the second seed metal material layer that is not covered by the second electroplated metal material layer may be removed by etching. The remaining part of the second seed metal material layer forms the second seed metal layer 421, and the remaining part of the second electroplated metal material layer forms the second electroplated metal layer 422.

Figure 9:
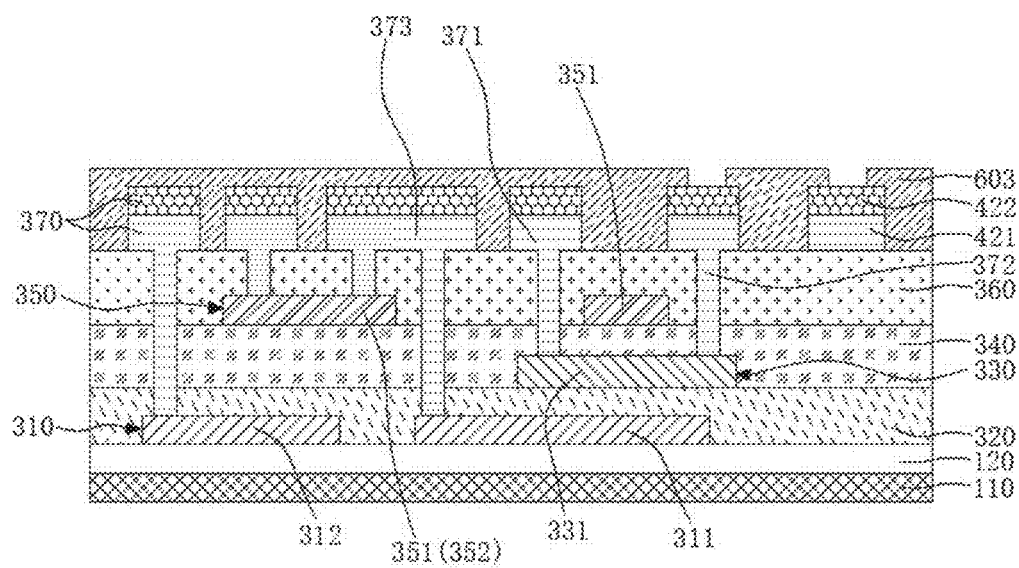
FIG. 9 is a schematic structural diagram of forming a third passivation layer according to some embodiments of the disclosure.

In some embodiments, as shown in FIG. 3 and FIG. 9, the array substrate may further include a third passivation layer 603. The third passivation layer 603 is located on one side of the source-drain metal layer 370 away from the base substrate 110 for protection the source-drain metal layer 370, so as to prevent the active metal (e.g., copper) in the source-drain metal layer 370 from being corroded. In some embodiments, the thickness of the third passivation layer 603 is 100-200 nm, and the material may be silicon oxynitride.

In some embodiments as described above, the source-drain metal layer 370 is directly connected to the functional device 141. In this way, there is no need to prepare an electrode layer 390 for electrical connection with the functional device 141 on one side of the source-drain metal layer 370 away from the base substrate 110, thereby further reducing the number of film layers of the array substrate and the preparation process, especially further reducing the number of mask processes. In this way, the fabrication cost of the array substrate is reduced, and the thinning of the array substrate is facilitated.

In some embodiments, the first driving circuit 200 may further include a storage capacitor. As shown in FIG. 2 and FIG. 3, the first gate layer 310 further includes a first electrode plate 312 of the storage capacitor, and the second gate layer 350 further includes a second electrode plate 352 of the storage capacitor. In this way, the storage capacitor can be formed by the first gate layer 310 and the second gate layer 350, without the need to form the storage capacitor by the source-drain metal layer 370. In this way, the shape of the source-drain metal layer 370 can be simplified, and the preparation of the array substrate is facilitated. In addition, compared with the technical solution of using the source-drain metal layer 370 to form the storage capacitor, the solution according to the embodiments has smaller parasitic capacitance, which can reduce the influence of the parasitic capacitance on the performance of the array substrate.

Further, in the same first driving circuit 200, the second electrode plate 352 of the storage capacitor is electrically connected to the second gate 351 of the driving transistor. For example, the same electrode plate may be shared by them, or they may be connected to each other through a gate connection lead located at the second gate layer. Thus, in some embodiments, the gate bridge lead 373 may not be directly connected with the second gate 351 of the driving transistor, but may be connected with the second electrode plate 352 of the storage capacitor or the gate connection lead, so that the gate bridge lead 373 is electrically connected to the second gate 351 of the driving transistor.

The first electrode plate 312 of the storage capacitor may be connected to the source-drain metal layer 370, so that the first electrode plate is directly or indirectly connected to the source or drain of the driving transistor through the source-drain metal layer 370.

Figure 15:
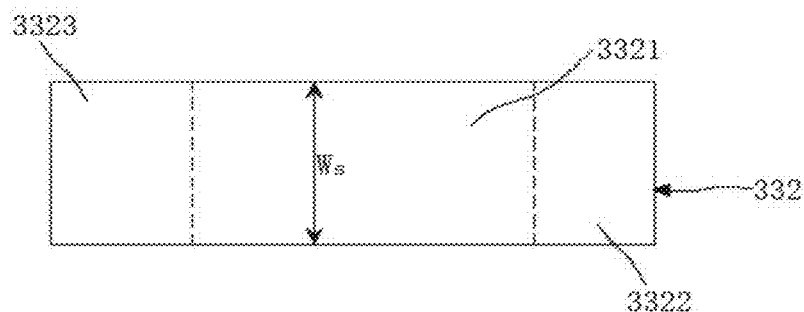
FIG. 15 is a schematic structural diagram of an active layer of a switch transistor according to some embodiments of the disclosure.

In some embodiments, the first driving circuit 200 further includes a switch transistor. Referring to FIG. 15, the semiconductor layer 330 further includes an active layer 332 of the switch transistor, and the active layer 332 of the switch transistor has a channel region 3321 of the switch transistor. The channel region 3311 of the driving transistor has a width $W_D$ greater than the width of the channel region 3321 of the switch transistor, $W_S$. In this way, the driving transistor 210 has a channel region with a larger width, which can increase the saturation current of the driving transistor 210 and further improve the ability of the driving transistor 210 to drive the functional device 141. In the disclosure, the width of the channel region refers to the size of the channel region along the direction perpendicular to the carrier migration direction in the plane where the semiconductor layer 330 is located.

It can be understood that the first driving circuit 200 may include one or more switch transistors according to functional requirements. For example, the switch transistor may include a data writing transistor for controlling the writing of data signals into the driving circuit, an enabling transistor (EM) for controlling whether to form the driving current, a reset transistor for controlling the reset signal, an initialization transistor for controlling the initialization of some nodes of the first driving circuit 200, and the like, which will not be described in detail in this disclosure.

In the following, a first driving circuit 200 is exemplarily described, so as to further explain and illustrate the structure and principle of the array substrate according to the disclosure.

Figure 16:
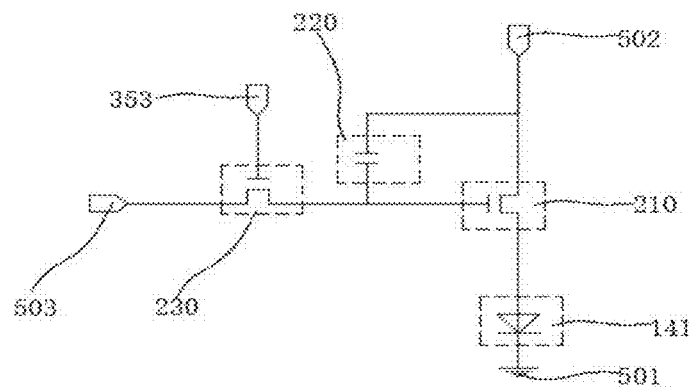
FIG. 16 is an equivalent circuit diagram of a first driving circuit according to some embodiments of the disclosure.

As shown in FIG. 16, the exemplary first driving circuit 200 is a driving circuit with a 2T1C (2 transistors and 1 storage capacitor 220) structure, which includes a driving transistor 210, a switch transistor 230 serving as a data writing transistor and a storage capacitor 220. The source of the driving transistor is connected to the power supply lead 502 and the first electrode plate of the storage capacitor, the drain of the driving transistor is connected to the functional device 141, and the first and second gates of the driving transistor 210 are connected to the second electrode plate of the storage capacitor. The source of the switch transistor is connected to the data lead 503, the gate of the switch transistor is connected to the scan lead 354, and the drain of the switch transistor is connected to the second electrode plate of the storage capacitor.

Figure 17:
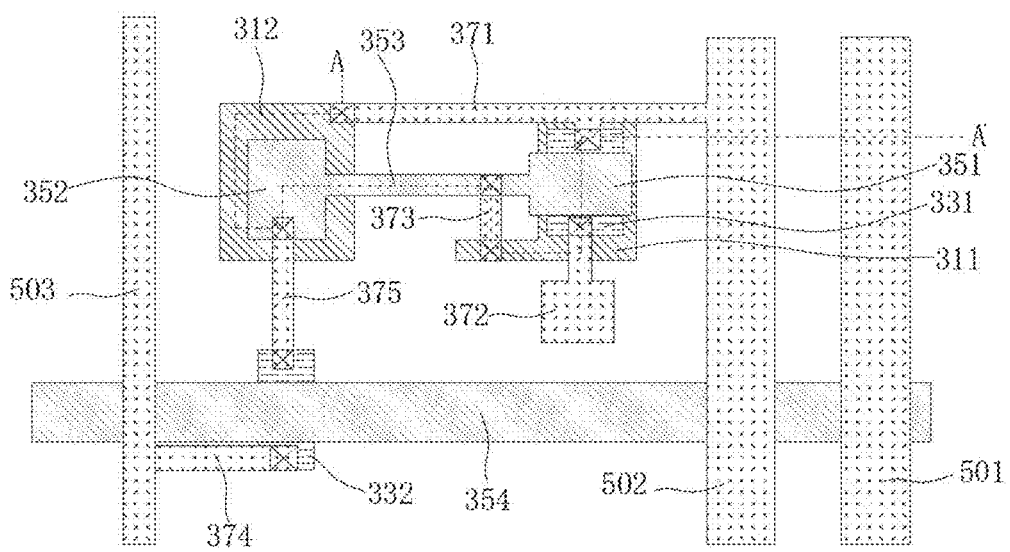
FIG. 17 is a schematic top view of a first gate layer, a semiconductor layer, a second gate layer, and a source-drain metal layer according to some embodiments of the disclosure.
Figure 22:
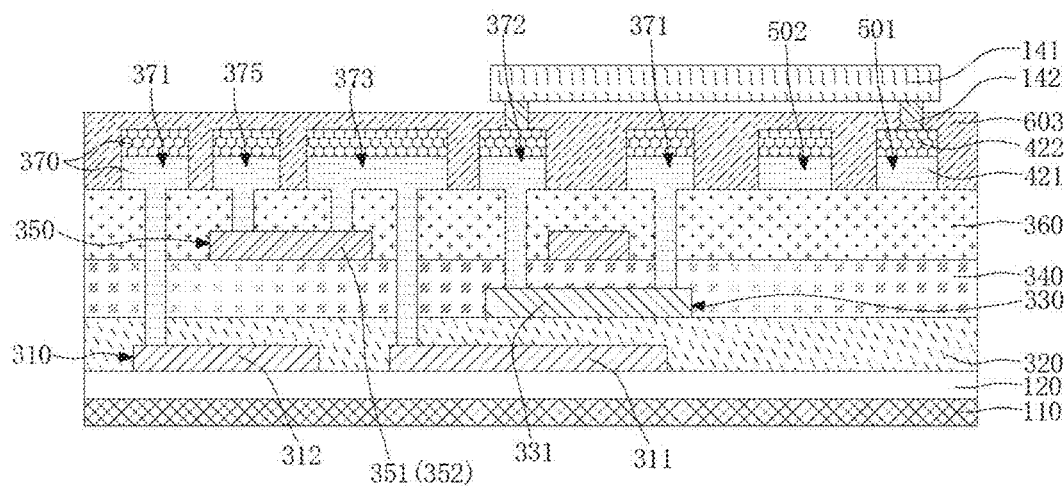
FIG. 22 is a schematic structural diagram of an array substrate when cut along AA' in FIG. 17 according to an embodiment of the disclosure.

Exemplarily, as shown in FIG. 17 and FIG. 22, the driving circuit layer 130 includes a first gate layer 310, a first gate insulating layer 320, a semiconductor layer 330, a second gate insulating layer 340, a second gate layer 350, an interlayer dielectric layer 360 and a source-drain metal layer 370 that are sequentially stacked.

Figure 18:
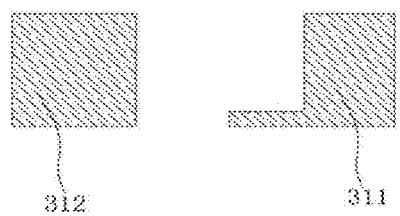
FIG. 18 is a schematic top view of the first gate layer according to some embodiments of the disclosure.

As shown in FIG. 17 and FIG. 18, the first gate layer 310 includes a first gate 311 of the driving transistor and a first electrode plate 312 of the storage capacitor. The first gate insulating layer 320 (not shown in FIG. 17 and FIG. 18) covers the first gate layer 310.

Figure 19:
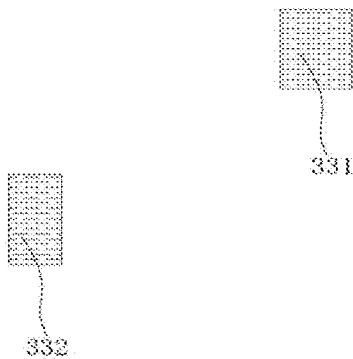
FIG. 19 is a schematic top view of a semiconductor layer in some embodiments of the disclosure.

As shown in FIG. 17 and FIG. 19, the semiconductor layer 330 includes an active layer 331 of the driving transistor and an active layer 332 of the switch transistor. The active layer 331 of the driving transistor includes a source contact region, a drain contact region and a channel region. The orthographic projection of the channel region of the driving transistor on the first gate layer 310 is located in the first gate 311, and the orthographic projections of at least part of the first gate 311 and the active layer 331 of the driving transistor on the first gate layer 310 do not overlap with each other. The active layer 332 of the switch transistor includes a source contact region, a drain contact region, and a channel region. The second gate insulating layer 340 (not shown in FIG. 17 and FIG. 19) covers the semiconductor layer 330.

Figure 20:
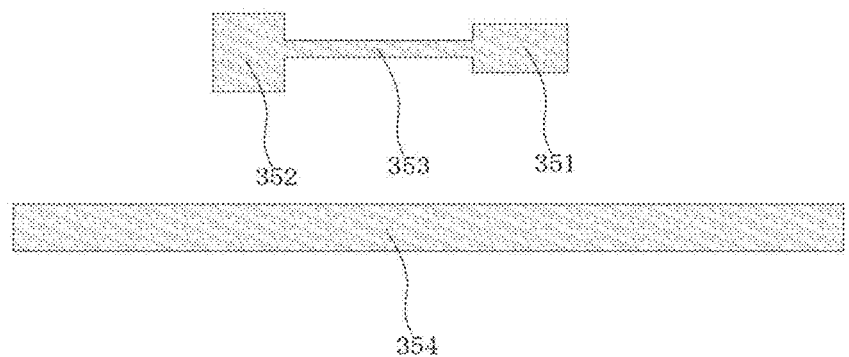
FIG. 20 is a schematic top view of the second gate layer according to some embodiments of the disclosure.

As shown in FIG. 17 and FIG. 20, the second gate layer 350 is disposed on one side of the second gate insulating layer 340 away from the base substrate 110, and includes a scan lead 354, a second gate 351 of the driving transistor, a second electrode plate 352 of the storage capacitor, and a gate connection lead 353. The orthographic projection of the scan lead 354 on the semiconductor layer 330 overlaps with the channel region 3321 of the switch transistor, so that the scan lead 354 can be reused as the gate of the switch transistor 230. The orthographic projection of the second gate 351 of the driving transistor on the semiconductor layer 330 covers the channel region 3311 of the driving transistor. The orthographic projection of the second electrode plate 352 of the storage capacitor on the first electrode layer 390 at least partially overlaps with the first electrode plate 312 of the storage capacitor. The gate connection lead 353 connects the second gate 351 of the driving transistor and the second electrode plate 352 of the storage capacitor.

Figure 21:
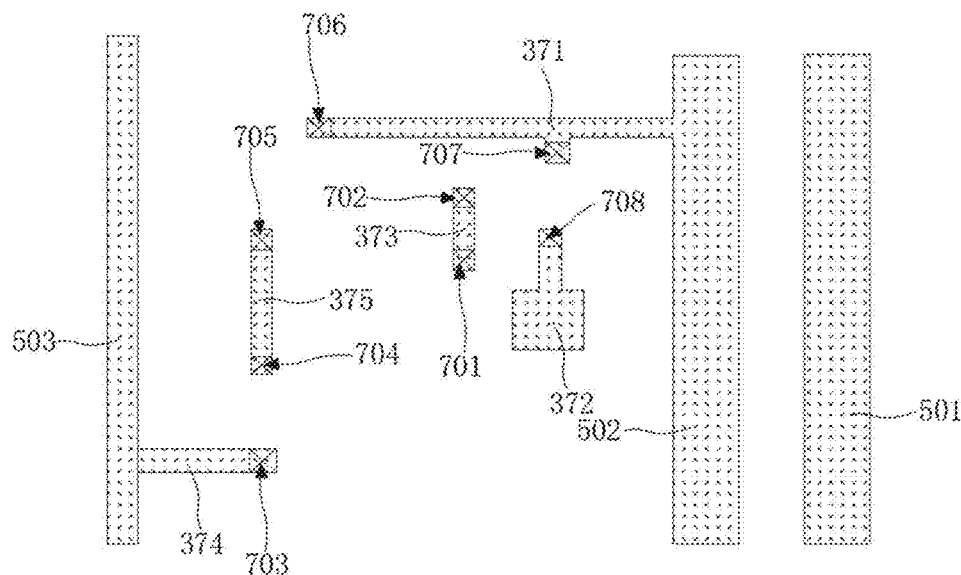
FIG. 21 is a schematic top view of a source-drain metal layer according to some embodiments of the disclosure.

An interlayer dielectric layer 360 (not shown in FIG. 17 and FIG. 21) is provided on one side of the second gate layer 350 away from the base substrate 110, and is provided with eight via holes. The positions of eight via holes are shown in FIG. 17 and FIG. 21. The first via hole 701 penetrates through the interlayer dielectric layer 360, the second gate insulating layer 340 and the first gate insulating layer 320, and exposes at least part of the first gate 311 the driving transistor. The second via hole 702 penetrates through the interlayer dielectric layer 360 and the second gate insulating layer 340, and exposes at least part of the second gate 351 of the driving transistor. The third via hole 703 penetrates the interlayer dielectric layer 360 and the second gate insulating layer 340, and exposes at least part of the source contact region 3322 of the switch transistor. The fourth via hole 704 penetrates the interlayer dielectric layer 360 and the second gate insulating layer 340, and exposes at least part of the drain contact region 3323 of the switch transistor. The fifth via hole 705 penetrates through the interlayer dielectric layer 360, and exposes at least part of the second electrode plate 352 of the storage capacitor. The sixth via hole 706 penetrates through the interlayer dielectric layer 360, the second gate insulating layer 340 and the first gate insulating layer 320, and exposes at least part of the first electrode plate 312 of the storage capacitor. The seventh via hole 707 penetrates through the interlayer dielectric layer 360 and the second gate insulating layer 340, and exposes at least part of the source contact region 3312 of the driving transistor. The eighth via hole 708 penetrates through the interlayer dielectric layer 360 and the second gate insulating layer 340, and exposes at least part of the drain contact region 3313 of the driving transistor.

As shown in FIG. 17 and FIG. 21, the source-drain metal layer 370 is disposed on one side of the interlayer dielectric layer 360 away from the base substrate 110, and includes a second conductive seed layer and a second electroplated metal layer 422 stacked in sequence. The source-drain metal layer 370 includes a data lead 503, a power supply lead 502, a second electrode 501, a gate bridge lead 373, a source 374 of the switch transistor, a drain 375 of the switch transistor, a source 371 of the driving transistor, and a drain 372 of the driving transistor.

The gate bridge lead 373 is connected to the first gate 311 of the driving transistor through the first via hole 701, and is connected to the second gate 351 of the driving transistor through the second via hole 702. The data lead 503 is connected to the source 374 of the switch transistor. The source 374 of the switch transistor is connected to the source contact region 3322 of the switch transistor through the third via hole 703. The drain 375 of the switch transistor is connected to the source contact 3322 of the switch transistor through the fourth via hole 704, and is connected to the second electrode plate 352 of the storage capacitor through the fifth via hole 705. The power supply lead 502 is connected to the source 371 of the driving transistor. The source 371 of the driving transistor is connected to the first electrode plate 312 of the storage capacitor through the sixth via hole 706. The source 371 of the driving transistor is connected to the source contact region 3312 of the driving transistor through the seventh via hole 707. The drain 372 of the driving transistor is connected to the drain contact region 3313 of the driving transistor through the eighth via hole 708.

In some embodiments, as shown in FIG. 1, the functional device layer 140 is provided on one side of the driving circuit layer 130 away from the base substrate 110, which may include functional devices 141 distributed in an array, for example, including light-emitting devices for emitting light, ultrasonic emitting devices for emitting ultrasonic waves, heating devices for generating heat, or other current-driven functional devices 141.

In some embodiments, as shown in FIG. 2 and FIG. 3, the functional device 141 is electrically connected to the driving circuit layer 130 through the conductive connector 142. The material of the conductive connector 142 may be conductive glue, solder paste or other conductive materials with adhesive ability.

Exemplarily, the functional device 141 may be an LED, a Mini LED or a Micro LED, and the Mini LED or the Micro LED may be electrically connected to the driving circuit layer 130 through solder paste.

Embodiments of the disclosure further provide a display panel, which includes any of the array substrates described in the foregoing array substrate embodiments, where the functional device 141 of the array substrate is a light-emitting device. The display panel may be an OLED display panel, a Micro LED display panel, a Mini LED display panel or other types of display panels. Since the display panel has the array substrate as described in the foregoing array substrate embodiments in which the functional device 141 is a light-emitting device, it has the same beneficial effects, and details thereof are not described herein again.

In some embodiments of the disclosure, the functional device 141 may be a Micro LED or a Mini LED.

Figure 23:
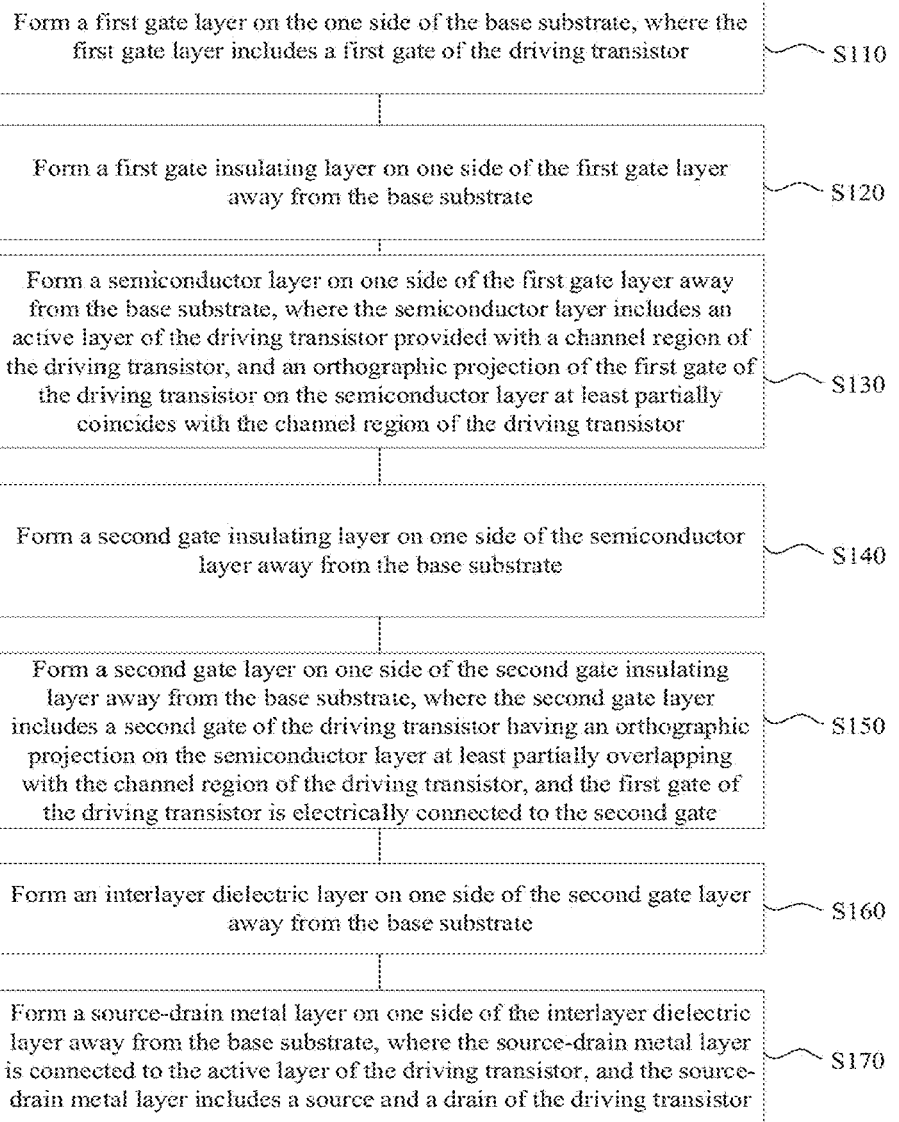
FIG. 23 is a schematic flowchart of a method for manufacturing a driving circuit layer according to some embodiments of the disclosure.

The disclosure also provides a method for manufacturing an array substrate, the method for manufacturing the array substrate includes sequentially forming a driving circuit layer 130 and a functional device layer 140 on one side of the base substrate 110. The driving circuit layer 130 is provided with a first driving circuit 200, the first driving circuit 200 at least includes a driving transistor 210. As shown in FIG. 23, forming the driving circuit layer 130 includes following steps.

In step S110, as shown in FIG. 5, a first gate layer 310 is formed on one side of the base substrate 110, and the first gate layer 310 includes a first gate 311 of the driving transistor.

In step S120, as shown in FIG. 5, a first gate insulating layer 320 is formed on one side of the first gate layer 310 away from the base substrate 110.

In step S130, as shown in FIG. 5, a semiconductor layer 330 is formed on one side of the first gate layer 310 away from the base substrate 110. The semiconductor layer 330 includes the active layer 331 of the driving transistor, and the active layer 331 of the driving transistor is provided with a channel region 3311 of the driving transistor. The orthographic projection of the first gate 311 of the driving transistor on the semiconductor layer 330 at least partially overlaps the channel region 3311 of the same driving transistor.

In step S140, as shown in FIG. 6, a second gate insulating layer 340 is formed on one side of the semiconductor layer 330 away from the base substrate 110.

In step S150, as shown in FIG. 6, a second gate layer 350 is formed on one side of the second gate insulating layer 340 away from the base substrate 110, and the second gate layer 350 includes the second gate 351 of the driving transistor. The orthographic projection of the second gate 351 of the driving transistor on the semiconductor layer 330 at least partially overlaps with the channel region 3311 of the same driving transistor. The first gate 311 of the same driving transistor may be electrically connected to the second gate.

In step S160, as shown in FIG. 7, an interlayer dielectric layer 360 is formed on one side of the second gate layer 350 away from the base substrate 110.

In step S170, as shown in FIG. 8 or FIG. 10, a source-drain metal layer 370 is formed on one side of the interlayer dielectric layer 360 away from the base substrate 110. The source-drain metal layer 370 is connected to the active layer 331 of the driving transistor, and the source-drain metal layer 370 includes the source 371 and the drain of the driving transistor.

Based on the method for manufacturing the array substrate according to the disclosure, any one of the array substrates described in the above-mentioned embodiments of the array substrate can be prepared. The details, principles and effects of each step of the manufacturing method of the array substrate have been described and introduced in detail in the above-mentioned embodiments of the array substrate, or can be clearly derived from the description of the above-mentioned embodiments of the array substrate, which will not be repeated here.

In some embodiments of the disclosure, forming the interlayer dielectric layer 360 on one side of the second gate layer 350 away from the base substrate 110 includes: forming an interlayer dielectric material layer on one side of the second gate layer 350 away from the base substrate 110; and forming, by performing a patterning operation on the interlayer dielectric material layer formed on the one side of the second gate layer 350 away from the base substrate 110, a first via hole 701 and a second via hole 702, where the first via hole 701 exposes at least a partial region of the first gate 311 of the driving transistor, and the second via hole 702 exposes at least a partial region of the second gate 351 of the driving transistor.

Forming of the source-drain metal layer 370 on one side of the interlayer dielectric layer 360 away from the base substrate 110 includes:
    forming a source-drain metal material layer on one side of the interlayer dielectric layer 360 away from the base substrate 110; and
    forming, by performing a patterning operation on the source-drain metal material layer, the source 371, the drain and the gate bridge lead 373 of the driving transistor, where the gate bridge lead 373 is connected to the first gate through the first via hole 701, and connected to the second gate through the second via hole 702.

In some embodiments of the disclosure, forming the driving circuit layer 230 may further include a following step.

As shown in FIG. 8 and FIG. 9, after the source-drain metal layer 370 is formed, the third passivation layer 603 is formed on one side of the source-drain metal layer 370 away from the base substrate.

In some embodiments of the disclosure, forming the driving circuit layer 230 may further include following steps.

As shown in FIG. 10 and FIG. 11, after the source-drain metal layer 370 is formed, the planarization layer 380 is formed on one side of the source-drain metal layer 370 away from the base substrate.

As shown in FIG. 12, the electrode layer 390 is formed on one side of the planarization layer 380 away from the base substrate.

As shown in FIG. 13, the second passivation layer 602 is formed on one side of the electrode layer 390 away from the base substrate.

It should be noted that although the various steps of the methods of the disclosure are described in a particular order in the drawings, this does not require or imply that the steps must be performed in that particular order, or that all illustrated steps must be performed in order to achieve the desired result. Additionally or alternatively, certain steps may be omitted, multiple steps may be combined into one step for execution, and/or one step may be decomposed into multiple steps for execution, all of which should be considered as part of the disclosure.

It should be understood that the disclosure does not limit its application to the detailed structure and arrangement of components set forth in this specification. The disclosure can be combined with other embodiments and can be implemented and carried out in various ways. Variations and modifications of the foregoing fall within the scope of the disclosure. It will be understood that the disclosure disclosed and defined in this specification extends to all alternative combinations of two or more of the individual features mentioned or evident in the specification and/or drawings. All of these different combinations constitute various alternative aspects of the disclosure. The embodiments of this specification illustrate the best mode known for carrying out the disclosure, and will enable any person skilled in the art to utilize the disclosure.

What is claimed is:

1. An array substrate, comprising a base substrate, a driving circuit layer and a functional device layer stacked in sequence; wherein the driving circuit layer is provided with a first driving circuit, and the first driving circuit comprises at least a driving transistor;
   the driving circuit layer comprises a first gate layer, a first gate insulating layer, a semiconductor layer, a second gate insulating layer, a second gate layer, an interlayer dielectric layer and a source-drain metal layer sequentially stacked on the base substrate; wherein,
   the first gate layer comprises a first gate of the driving transistor;
   the semiconductor layer comprises an active layer of the driving transistor, the active layer of the driving transistor is provided with a channel region of the driving transistor, and an orthographic projection of the first gate of the driving transistor on the semiconductor layer at least partially overlaps with the channel region of the driving transistor;
   the second gate layer comprises a second gate of the driving transistor, and an orthographic projection of the second gate of the driving transistor on the semiconductor layer at least partially overlaps with the channel region of the driving transistor;
   the source-drain metal layer comprises a source and a drain of the driving transistor;
   the first gate and the second gate of the driving transistor are electrically connected through the source-drain metal layer; and
   the functional device layer comprises a functional device, and the functional device is electrically connected to the drain of the driving transistor.

2. The array substrate according to claim 1, wherein the source-drain metal layer further comprises a gate bridge lead of the driving transistor; and in the driving transistor, the first gate and the second gate are connected with the gate bridge lead.

3. The array substrate according to claim 2, wherein the driving circuit layer comprises a first via hole and a second via hole;
   the first via hole penetrates through the interlayer dielectric layer, the second gate insulating layer and the first gate insulating layer, and exposes at least a partial region of the first gate of the driving transistor;
   the second via hole penetrates the interlayer dielectric layer and the second gate insulating layer, and exposes at least a partial region of the second gate of the driving transistor; and
   the gate bridge lead is connected to the first gate through the first via hole, and connected to the second gate through the second via hole.

4. The array substrate according to claim 1, wherein the first driving circuit further comprises a storage capacitor; the first gate layer further comprises a first electrode plate of the storage capacitor, and the second gate layer further comprises a second electrode plate of the storage capacitor.

5. The array substrate according to claim 1, wherein the first driving circuit further comprises a switch transistor; the semiconductor layer further comprises an active layer of the switch transistor, the active layer of the switch transistor is provided with a channel region of the switch transistor; and a width of the channel region of the driving transistor is greater than a width of the channel region of the switch transistor.

6. The array substrate according to claim 1, wherein a material of the semiconductor layer comprises low temperature polysilicon.

7. The array substrate according to claim 6, wherein a thickness of the semiconductor layer is 30-60 nanometers.

8. The array substrate according to claim 1, wherein the driving circuit layer further comprises:
   a planarization layer, disposed on one side of the source-drain metal layer away from the base substrate; and
   an electrode layer, disposed on one side of the planarization layer away from the base substrate, and having a thickness greater than 1 micron; wherein the electrode layer comprises a first electrode of the first driving circuit and a second electrode; and in the first driving circuit, the first electrode is connected to the drain of the driving transistor;
   wherein the functional device is connected to the second electrode and the first electrode.

9. The array substrate according to claim 8, wherein the electrode layer comprises:
   a first seed metal layer, disposed on one side of the source-drain metal layer away from the base substrate, connected to the drain of the driving transistor, and having a thickness not greater than 1 micron; and a first electroplated metal layer, disposed on one side of the first seed metal layer away from the base substrate, and having a thickness of 1-20 microns;
wherein the functional device is connected to the first electroplated metal layer.

10. The array substrate according to claim 8, wherein the electrode layer further comprises a power supply lead, and the power supply lead is connected to the source of the driving transistor.

11. The array substrate according to claim 1, wherein the source-drain metal layer comprises:
a second seed metal layer, disposed on one side of the interlayer dielectric layer away from the base substrate, connected to the active layer of the driving transistor, and having a thickness not greater than 1 micron; and
a second electroplated metal layer, disposed on one side of the second seed metal layer away from the base substrate, and having a thickness of 1-20 microns.

12. The array substrate according to claim 11, wherein the source-drain metal layer further comprises a second electrode and a power supply lead; the power supply lead is connected to the source of the driving transistor, and the functional device is connected to the second electrode and the drain of the driving transistor.

13. A method for manufacturing an array substrate, comprising sequentially forming a driving circuit layer and a functional device layer on one side of a base substrate; wherein the driving circuit layer is provided with a first driving circuit, and the first driving circuit comprises at least a driving transistor; and forming the driving circuit layer comprises:
forming a first gate layer on the one side of the base substrate, wherein the first gate layer comprises a first gate of the driving transistor;
forming a first gate insulating layer on one side of the first gate layer away from the base substrate;
forming a semiconductor layer on one side of the first gate layer away from the base substrate, wherein the semiconductor layer comprises an active layer of the driving transistor, the active layer of the driving transistor is provided with a channel region of the driving transistor, and an orthographic projection of the first gate of the driving transistor on the semiconductor layer at least partially coincides with the channel region of the driving transistor;
forming a second gate insulating layer on one side of the semiconductor layer away from the base substrate;
forming a second gate layer on one side of the second gate insulating layer away from the base substrate, wherein the second gate layer comprises a second gate of the driving transistor, an orthographic projection of the second gate of the driving transistor on the semiconductor layer at least partially overlaps with the channel region of the driving transistor, and the first gate of the driving transistor is electrically connected to the second gate;
forming an interlayer dielectric layer on one side of the second gate layer away from the base substrate; and
forming a source-drain metal layer on one side of the interlayer dielectric layer away from the base substrate, wherein the source-drain metal layer is connected to the active layer of the driving transistor, and the source-drain metal layer comprises a source and a drain of the driving transistor.

14. The method for manufacturing the array substrate according to claim 13, wherein forming the interlayer dielectric layer on the one side of the second gate layer away from the base substrate comprises:
forming an interlayer dielectric material layer on the one side of the second gate layer away from the base substrate; and
forming, by performing a patterning operation on the interlayer dielectric material layer formed on the one side of the second gate layer away from the base substrate, a first via hole and a second via hole, wherein the first via hole exposes at least a partial region of the first gate of the driving transistor, and the second via hole exposes at least a partial region of the second gate of the driving transistor;
forming the source-drain metal layer on the one side of the interlayer dielectric layer away from the base substrate comprises:
forming a source-drain metal material layer on the one side of the interlayer dielectric layer away from the base substrate; and
forming, by performing a patterning operation on the source-drain metal material layer, the source, the drain and a gate bridge lead of the driving transistor, wherein the gate bridge lead is connected to the first gate through the first via hole, and connected to the second gate through the second via hole.

15. A display panel, comprising an array substrate, wherein the array substrate comprises a base substrate, a driving circuit layer and a functional device layer stacked in sequence; the driving circuit layer is provided with a first driving circuit, and the first driving circuit comprises at least a driving transistor;
the driving circuit layer comprises a first gate layer, a first gate insulating layer, a semiconductor layer, a second gate insulating layer, a second gate layer, an interlayer dielectric layer and a source-drain metal layer sequentially stacked on the base substrate; wherein,
the first gate layer comprises a first gate of the driving transistor;
the semiconductor layer comprises an active layer of the driving transistor, the active layer of the driving transistor is provided with a channel region of the driving transistor, and an orthographic projection of the first gate of the driving transistor on the semiconductor layer at least partially overlaps with the channel region of the driving transistor;
the second gate layer comprises a second gate of the driving transistor, and an orthographic projection of the second gate of the driving transistor on the semiconductor layer at least partially overlaps with the channel region of the driving transistor;
the source-drain metal layer comprises a source and a drain of the driving transistor;
the first gate and the second gate of the driving transistor are electrically connected through the source-drain metal layer; and
the functional device layer comprises a functional device, and the functional device is electrically connected to the drain of the driving transistor.

16. The display panel according to claim 15, wherein the source-drain metal layer further comprises a gate bridge lead of the driving transistor; and in the driving transistor, the first gate and the second gate are connected with the gate bridge lead.

17. The display panel according to claim 15, wherein the first driving circuit further comprises a storage capacitor; the first gate layer further comprises a first electrode plate of the storage capacitor, and the second gate layer further comprises a second electrode plate of the storage capacitor.

18. The display panel according to claim 15, wherein the first driving circuit further comprises a switch transistor; the semiconductor layer further comprises an active layer of the switch transistor, the active layer of the switch transistor is provided with a channel region of the switch transistor; and a width of the channel region of the driving transistor is greater than a width of the channel region of the switch transistor.

19. The display panel according to claim 15, wherein a material of the semiconductor layer comprises low temperature polysilicon.

20. The display panel according to claim 15, wherein the driving circuit layer further comprises:
- a planarization layer, disposed on one side of the source-drain metal layer away from the base substrate; and
- an electrode layer, disposed on one side of the planarization layer away from the base substrate, and having a thickness greater than 1 micron; wherein the electrode layer comprises a first electrode of the first driving circuit and a second electrode; and in the first driving circuit, the first electrode is connected to the drain of the driving transistor;
- wherein the functional device is connected to the second electrode and the first electrode.

\* \* \* \* \*